(12) United States Patent
Schicketanz et al.

(10) Patent No.: US 9,915,876 B2
(45) Date of Patent: Mar. 13, 2018

(54) EUV MIRROR AND OPTICAL SYSTEM COMPRISING EUV MIRROR

(71) Applicant: Carl Zeiss SMT GMBH, Oberkochen (DE)

(72) Inventors: Thomas Schicketanz, Aalen (DE); Hans-Jochen Paul, Aalen (DE); Christoph Zaczek, Heubach (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 267 days.

(21) Appl. No.: 14/796,612

(22) Filed: Jul. 10, 2015

(65) Prior Publication Data

US 2016/0195648 A1    Jul. 7, 2016

Related U.S. Application Data

(63) Continuation of application No. PCT/EP2013/075830, filed on Dec. 6, 2013.
(Continued)

(30) Foreign Application Priority Data

Jan. 11, 2013 (DE) .................. 10 2013 200 294

(51) Int. Cl.
*G03B 27/70* (2006.01)
*G03B 27/54* (2006.01)
(Continued)

(52) U.S. Cl.
CPC .......... *G03F 7/70316* (2013.01); *B82Y 10/00* (2013.01); *G02B 5/0816* (2013.01);
(Continued)

(58) Field of Classification Search
CPC .... G02B 5/0816; G02B 5/0891; G21K 1/062; G21K 2201/067; B82Y 10/00;
(Continued)

(56) References Cited

U.S. PATENT DOCUMENTS

| 2006/0192147 A1 | 8/2006 | Kandaka et al. |
| 2011/0104595 A1 | 5/2011 | Hayashi et al. |
| 2013/0038929 A1 | 2/2013 | Muellender et al. |

FOREIGN PATENT DOCUMENTS

| CN | 1868033 A | 11/2006 |
| CN | 102089860 A | 6/2011 |

(Continued)

OTHER PUBLICATIONS

International Search Report in counterpart International Application No. PCT/EP2013/075830, dated Feb. 18, 2014.
(Continued)

*Primary Examiner* — Christina Riddle
(74) *Attorney, Agent, or Firm* — Edell, Shapiro & Finnan, LLC

(57) ABSTRACT

An EUV mirror with a substrate and a multilayer arrangement including: a periodic first layer group having N1>1 first layer pairs of period thickness P1 and arranged on a radiation entrance side of the multilayer arrangement; a periodic second layer group having N2>1 second layer pairs of period thickness P2 and arranged between the first layer group and the substrate; and a third layer group having N3 third layer pairs arranged between the first and second layer groups. N1>N2. The third layer group has a third period thickness P3 which deviates from an average period thickness $P_M=(P1+P2)/2$ by a period thickness difference ΔP. ΔP corresponds to the quotient of the optical layer thickness (λ/4) of a quarter-wave layer and the product of N3 and
(Continued)

$\cos(AOI_M)$, $AOI_M$ being the mean incidence angle for which the multilayer arrangement is designed.

22 Claims, 11 Drawing Sheets

Related U.S. Application Data

(60) Provisional application No. 61/751,378, filed on Jan. 11, 2013.

(51) Int. Cl.
| | | |
|---|---|---|
| *G03F 7/20* | (2006.01) | |
| *G21K 1/06* | (2006.01) | |
| *B82Y 10/00* | (2011.01) | |
| *G02B 5/08* | (2006.01) | |

(52) U.S. Cl.
CPC ........... *G02B 5/0891* (2013.01); *G03F 7/702* (2013.01); *G03F 7/70958* (2013.01); *G21K 1/062* (2013.01); *G21K 2201/067* (2013.01)

(58) Field of Classification Search
CPC ............... G03F 7/7015; G03F 7/70166; G03F 7/70175; G03F 7/702; G03F 7/70316; G03F 7/70958; G03F 7/70233; G03F 7/70191; G03F 7/70308
USPC ............... 355/30, 52, 53, 55, 60, 66, 67–71; 250/492.1, 492.2, 492.22, 493.1, 503.1, 250/504 R; 359/359
See application file for complete search history.

(56) References Cited

FOREIGN PATENT DOCUMENTS

| | | |
|---|---|---|
| CN | 102713690 A | 10/2012 |
| DE | 102009054653 A1 | 6/2011 |
| EP | 1675164 A1 | 6/2006 |
| WO | 2011157643 A1 | 12/2011 |
| WO | 2012113591 A1 | 8/2012 |

OTHER PUBLICATIONS

Shiraishi, M., et al., "Stress Reduction of Molybdenum/Silicon Multilayers Deposited by Ion-Beam Sputtering", Proceedings of SPIE, vol. 3997, Jul. 21, 2000, pp. 620-627.

Kuhlmann, T., et al., "EUV Multilayer Mirrors with Tailored Spectral Reflectivity", Proceedings of SPIE, vol. 4782, Dec. 1, 2002, pp. 196-203.

Wang, Z., et al., "Broadband Multilayer Mirrors for Optimum Use of Soft X-Ray Source Output", J. Opt. A; Pure Appl. Opt 2 (2000) 452-457.

Wang, Z., et al., "Optimisation of Depth-Graded Multilayer Designs for EUV and X-Ray Optics", Proceedings of SPIE, vol. 4145, (2001), p. 243-253.

Office Action in corresponding German Application No. 10 2013 200 294.7, dated Jun. 17, 2013, along with an English translation.

Office Action in corresponding Chinese Application 201380070253.x, dated Sep. 8, 2016, along with English Translation.

EUV MIRROR AND OPTICAL SYSTEM COMPRISING EUV MIRROR

CROSS REFERENCE TO RELATED APPLICATIONS

This application is a Continuation of International Application No. PCT/EP2013/075830, filed on Dec. 6, 2013, which claims benefit under 35 U.S.C. § 119(e) to U.S. Provisional Application No. 61/751,378, filed Jan. 11, 2013, and which claims priority under 35 U.S.C. § 119(a) to German Patent Application No. 10 2013 200 294.7, also filed on Jan. 11, 2013. The disclosures of all three related applications are considered part of and are incorporated by reference into the disclosure of the present application in their respective entireties.

FIELD OF THE INVENTION

The invention relates to a mirror for extreme ultraviolet light (EUV mirror) and to an optical system comprising such an EUV mirror. One preferred field of application is EUV microlithography. Other fields of application are in EUV microscopy and EUV mask metrology.

BACKGROUND

Nowadays predominantly microlithographic projection exposure methods are used for producing semiconductor components and other finely structured components, e.g. masks for microlithography. In this case, use is made of masks (reticles) or other patterning devices which carry or form the pattern of a structure to be imaged, e.g. a line pattern of a layer of a semiconductor component. The pattern is positioned in a projection exposure apparatus between an illumination system and a projection lens in the region of the object plane of the projection lens and illuminated with an illumination radiation provided by the illumination system. The radiation altered by the pattern passes as projection radiation through the projection lens, which images the pattern onto the substrate to be exposed, which is coated with a radiation-sensitive layer and the surface of which lies in the image plane of the projection lens, said image plane being optically conjugate with respect to the object plane.

In order to be able to produce ever finer structures, in recent years optical systems have been developed which operate with moderate numerical apertures and achieve high resolution capabilities substantially through the short wavelength of the used electromagnetic radiation from the extreme ultraviolet range (EUV), in particular having operating wavelengths in the range of between 5 nm and 30 nm. In the case of EUV lithography having operating wavelengths of around 13.5 nm, for example given image-side numerical apertures of NA=0.3, it is theoretically possible to achieve a resolution of the order of magnitude of 0.03 µm in conjunction with typical depths of focus of the order of magnitude of approximately 0.15 µm.

Radiation from the extreme ultraviolet range cannot be focused or guided with the aid of refractive optical elements, since the short wavelengths are absorbed by the known optical materials that are transparent at higher wavelengths. Therefore, mirror systems are used for EUV lithography. One class of EUV mirrors operates at relatively high angles of incidence of the incident radiation, that is to say with grazing incidence according to the principle of total reflection. Multilayer mirrors are used for normal or almost normal incidence. Such a mirror (EUV mirror) having a reflective effect for radiation from the EUV range has a substrate, on which is applied a multilayer arrangement having a reflective effect for radiation from the extreme ultraviolet range (EUV) and having a large number of layer pairs comprising alternately low refractive index and high refractive index layer material. Layer pairs for EUV mirrors are often constructed with the layer material combinations molybdenum/silicon (Mo/Si) or ruthenium/silicon (Ru/Si).

It is known that the reflectivity or reflectance of multilayer mirrors is greatly dependent on the angle of incidence and on the wavelength of the impinging EUV radiation. A high maximum value of the reflectivity can be achieved if the multilayer arrangement substantially consists of a periodic layer sequence having a multiplicity of identical layer pairs. In that case, however, a relatively low value of the full width at half maximum (FWHM) of the reflectivity curve results both in the case of the dependence of the reflectivity on the angle of incidence and in the case of the dependence of the reflectivity on the wavelength. The prior art discloses examples of the angle of incidence dependence and wavelength dependence of the reflectivity of conventional multilayer mirrors.

In optical systems for the EUV range having a relatively high numerical aperture, for example in projection lenses for EUV microlithography, relatively high variations in the angle of incidence can occur, however, at certain positions in the beam path. In this respect, EUV mirrors are required which have a reflectance that varies only little over the angle-of-incidence range that respectively occurs. Numerous proposals have already been made for the construction of such multilayer mirrors that are broadband in terms of the angle-of-incidence range.

The article "EUV multilayer mirrors with tailored spectral reflectivity" by T. Kuhlmann, S. Yulin, T. Feigl and M. Kaiser in: Proceedings of SPIE Vol. 4782 (2002), pages 196 to 203, describes a special layer construction of EUV mirrors having a broadband effect. The multilayer arrangement comprises a plurality of layer groups each having a periodic sequence of at least two individual layers—forming a period—of different materials. The number of periods and the thickness of the periods of the individual layer groups decrease from the substrate toward the surface. One exemplary embodiment has three different layer groups. What is intended to be achieved by this layer construction is that, firstly, the peak wavelengths of the reflection maxima of the respective layer groups from the substrate toward the surface are shifted to shorter wavelengths, such that a wider reflection peak of the overall system is produced by the superimposition of the reflection of the individual layer groups. Secondly, all of the layer groups can contribute approximately identically to the reflectivity of the overall system. In this way, it is possible to achieve an almost constant reflectivity over a large wavelength range or angular range.

The article "Broadband multilayer mirrors for optimum use of soft x-ray source output" by Z. Wang and A. G. Michette in: J. Opt. A: Pure Appl. Opt. 2 (2000), pages 452-457, and the article "Optimization of depth-graded multilayer designs for EUV and X-ray optics" by Z. Wang and A. G. Michette in: Proceedings of SPIE Vol. 4145 (2001), pages 243-253, indicate examples of EUV mirrors having a broadband effect in which the broadband character is achieved by virtue of the fact that the layer thicknesses of the individual layers of the multilayer coating vary individually in the depth direction of the multilayer arrangement as a result of an optimization process. Such multilayer arrangements having a stochastic sequence of individual layers optimized by way of a simulation program are also designated as "depth-graded multilayers". The production of such multilayer arrangements can be difficult, since layers having many different layer thicknesses have to be produced successively in a coating process.

The prior art discloses broadband EUV mirrors for normal or almost normal incidence which have a multilayer arrangement having different groups of layer pairs. A surface layer film group is arranged at the radiation entrance side of the multilayer arrangement. Opposite the radiation entrance side there follows an additional layer. This is followed in the direction of the substrate by a deeper group of layer pairs (deep layer film group). In this case, the reflectivity of the surface layer film group is higher than the reflectivity of the deeper layer group near the substrate, and the reflected radiation is phase-shifted on account of the presence of the additional layer such that a reflectivity peak value of the entire multilayer arrangement is lower and the reflectivity around the peak wavelength is higher than in the absence of the additional layer. The optical layer thickness of the additional layer is intended to correspond to approximately one quarter of the wavelength of the EUV radiation (i.e. $\lambda/4$) or half of the period thickness of the multilayer arrangement or this value plus an integral multiple of the period thickness. In one exemplary embodiment, the additional layer consists of silicon and is arranged directly adjacent to a silicon layer of a molybdenum/silicon layer pair, such that a silicon layer having a layer thickness which corresponds to at least half the wavelength, i.e. at least $\lambda/2$, is situated within the multilayer arrangement.

SUMMARY

A problem addressed by the invention is that of providing an EUV mirror which has only little variation of the reflectance over a large angle-of-incidence range and which can furthermore be produced with high precision.

For solving this problem, the invention provides an EUV mirror as well as an associated optical system.

Advantageous developments are specified in the dependent claims. The wording of all the claims is incorporated by a reference in the content of the description.

The first and second layer groups each have two or more layer pairs which directly adjoin one another or are directly adjacent to one another and which can be characterized in each case by an associated period thickness P1, P2. The third layer group consists of a single layer pair or of a plurality of layer pairs, each having an associated period thickness P3.

A layer pair in each case comprises a layer composed of a relatively high refractive index layer material and a layer composed of a (relative thereto) low refractive index layer material. Such layer pairs are also referred to as a "double layer" or "bilayer". The period thickness is substantially given by $$P = \left(\sum_{i=1}^{k} n_i d_i\right)$$

In this case, k is the number of layers in a layer pair, $n_i$ is the refractive index of the respective layer material, and $d_i$ is the geometrical layer thickness. A layer pair can also have, in addition to the two layers composed of relatively high refractive index and relatively low refractive index layer material, respectively, one or a plurality of further layers, for example an interposed barrier layer for reducing interdiffusion between adjacent layers.

A multilayer arrangement having a large number of layer pairs acts in the manner of a "distributed Bragg reflector". In this case, the layer arrangement simulates a crystal whose lattice planes leading to the Bragg reflection are formed by the layers of the material having the lower real part of the refractive index. The optimum period thickness of the layer pairs is determined by the Bragg equation for a predefined wavelength and for a predefined angle of incidence or angle-of-incidence range and is generally between 1 nm and 10 nm.

In this application, the term "periodic layer group" designates a layer group having two or more directly adjacent layer pairs whose period thicknesses are nominally identical or similar such that the period thickness fluctuates by a maximum of 10%.

The term "strictly periodic layer group" designates a periodic layer group in which in addition the different individual layer thicknesses in a period are identical for all the periods.

Every strictly periodic layer group is also a periodic layer group, whereas not every periodic layer group need be a strictly periodic layer group.

In the case of a strictly periodic construction of a layer group, in general during production it is necessary to produce layer thicknesses that differ only relatively little in each case for the layer materials, as a result of which production is simplified in comparison with periodically, but not strictly periodically, constructed layer arrangements.

The periodic first layer group is arranged in the vicinity of the radiation entrance side of the multilayer arrangement. A layer of the first layer group that is remote from the substrate can adjoin the surroundings. However, it is also possible for a cap layer also to be applied at that side of the first layer group which faces away from the substrate side, which cap layer can be formed by a single layer or a combination of two or more layers.

In particular, the first layer group can also be strictly periodic.

The periodic second layer group is arranged between the first layer group and the substrate, that is to say is nearer to the substrate. The second layer group can be applied directly to the substrate surface. One or a plurality of further layers, which can serve for example for compensating for layer stresses, can be arranged between the substrate surface and the second layer group.

In particular, the second layer group can also be strictly periodic.

Preferably, both the first layer group and the second layer group are strictly periodic. This is not mandatory, however.

The first number N1 of layer pairs of the first layer group is greater than the second number N2 of layer pairs of the second layer group. Furthermore, the first layer group is nearer to the radiation entrance side than the second layer group. This contributes to the fact that the reflectivity of the first layer group near the surface is higher than the reflectivity of the second layer group nearer the substrate.

A third layer group is arranged between the first layer group and the second layer group. An essential function of the third layer group is to produce a phase shift between the partial beams reflected within the first layer group and the partial beams reflected within the second layer group in such a way that the maximum value of the reflectivity of the entire multilayer arrangement in the angle-of-incidence range under consideration is lower than the reflectivity of a layer arrangement which would be produced only by the first layer group and the second layer group without an interposed third layer group. What is achieved at the same time is that the reflectivity curve in the region around the reflectivity maximum in the angle-of-incidence range under consideration has a higher value of the full width at half maximum than in the case of the same layer arrangement without the third layer group. For a given operating wavelength, in the angle-of-incidence range under consideration, this results in a reduction of the variation of the reflectivity depending on the angle of incidence, with the result that such an EUV mirror has more usable reflectivity values over a larger angle-of-incidence range than a corresponding EUV mirror without the third layer group.

The third layer group has a third period thickness P3 which deviates from a mean period thickness $P_M=(P1+P2)/2$ by a period thickness difference $\Delta P$. The following thus holds true: $P3=P_M\pm\Delta P$. The period thickness difference $\Delta P$ substantially corresponds to the quotient of the optical layer thickness ($\lambda/4$) of a quarter-wave layer for the corresponding wavelength and the third number N3 of the layer pairs of the third layer group. In this case, the optical layer thickness results as the product of the geometrical layer thickness and the refractive index of the respective layer material, which is near the value 1 in the EUV wavelength range.

In this case, the term "third period thickness P3", in the case of third layer groups having a plurality of layer pairs, designates the mean value of the period thicknesses within the third layer group. If these are constant, P3 is identical to the period thickness of each of the third layer pairs. However, the period thicknesses of the third layer pairs can also vary.

In the first and second layer groups, too, the period thicknesses can vary slightly, but generally to a significantly lesser extent than in the third layer group. In this respect, the terms "first period thickness" and "second period thickness" in each case designate a mean value of the period thicknesses of the respective layer group.

The third layer group can approximately be described in terms of its effect such that a quarter-wave layer interposed between the first layer group and the second layer group is involved, but the total layer thickness of said quarter-wave layer is distributed among a plurality of layers of the third layer group. In this case, the layer thicknesses of all the layers of the third layer group are less than the mean period thickness $P_M$. What can thus be achieved is that although the third layer group acts as a phase shifting layer group, at the same time there are no individual layers present whose layer thickness is in the vicinity of $\lambda/(2*\cos(AOI_M))$ or more. By dispensing with layer thicknesses in the range of $\lambda/(2*\cos(AOI_M))$ or more, it is possible to simplify the production of the multilayer arrangement. According to the inventors' observations, the growth behavior can vary over the thickness of a layer. By way of example, during the production of relatively thick individual layers, crystallization effects can occur in the layer material of the layer being built up, as a result of which it can be difficult to produce a specific desired layer thickness with the required accuracy during the production process. Moreover, large layer thicknesses can lead to increased layer roughness and to altered refractive indexes. These problems can be avoided if relatively large layer thicknesses of individual layers are dispensed with.

Preferably, a maximum individual layer thickness in the third layer group is less than $0.9*\lambda/(2*\cos(AOI_M))$, in particular less than $0.85*\lambda/(2*\cos(AOI_M))$ or less than $0.8*\lambda/(2*\cos(AOI_M))$.

In particular, it can be advantageous with regard to producibility to choose the maximum layer thickness to be even less than the maximum layer thicknesses in the first and second layer groups. That completely avoids thick layers.

The period thickness difference $\Delta P$ is intended substantially to correspond to the quotient of the optical layer thickness of a $\lambda/4$ layer (quarter-wave layer) and the third number N3. Preferably, the condition $\Delta P=x*(\lambda/(N3\cos(AOI_M)))$ holds true for the period thickness difference, where $0.2\leq x\leq 0.35$ holds true. In this case, the parameter $AOI_M$ corresponds to the mean angle of incidence for which the multilayer arrangement is designed. It has proved to be particularly expedient if the parameter x is in the range of between 0.25 and 0.35.

The phase shifting third layer group is not intended to make a substantial contribution to the total reflectivity. It serves substantially only for the phase shift between the first and second layer groups. The layer thicknesses in the third layer group are chosen such that they are not or not well suited as reflector for the wavelength or for the angle-of-incidence range. Therefore, the reflectivity of the third layer group is low. The third number N3 should not be too high since the contribution of the third layer group to the absorption increases as N3 increases.

It is possible for the third layer group to consist only of a single layer pair, such that N3=1 holds true. Preferably, the third number N3 is in the range of 2 to 5, in particular 2 or 3. The desired phase shift can then be obtained without causing an unnecessarily large amount of absorption in the third layer group.

If the third layer group has two or more layer pairs, then it can be advantageous if the third layer group has a periodic layer construction having substantially identical third period thicknesses, such that a periodic third layer group is involved. In particular, it can be advantageous if the third layer group is even strictly periodic. This simplifies production.

The first layer group and/or the second layer group can have more layer pairs than the third layer group by a multiple. Preferably, the first number N1 of layer pairs of the first layer group is 10 or more, in particular 15 or more, or 20 or more. What can thereby be achieved is that the first layer group near the surface makes a particularly great contribution to the total reflectivity.

The novel layer design offers many degrees of freedom of design for the configuration of the layer thicknesses of the third layer group. In particular, the concept makes it possible that critical layer thicknesses can be avoided. "Critical layer thicknesses" here denote such layer thicknesses which can be produced with particular difficulty depending on the layer material and on the production process. In the case of some layer materials, for example, crystallization effects can occur if the layer thickness exceeds a certain value, such that layer thickness values above that value for which the crystallization occurs can be produced with the required accuracy only with difficulty. Such problems can be avoided if correspondingly thin layer thicknesses are selected. In some embodiments, the third layer group has a third period thickness P3 which is less than the mean period thickness $P_M$ by the period thickness difference $\Delta P$. Such a variant can be chosen for example if a greatly absorbent layer material is intended to be used for the construction of the third layer group. However, there are also embodiments in which the third layer group has a third period thickness P3 which is greater than the mean period thickness $P_M$ by the period thickness difference $\Delta P$.

In some embodiments, a single phase shifting layer group (third layer group) having relatively thin individual layers is provided. However, for a further homogenization of the angle-of-incidence dependence of the reflectivity, it can be expedient if at least one further phase shifting layer group is provided. In some embodiments, there is a fourth layer group having a fourth number N4 of fourth layer pairs arranged between the third layer group and the substrate, wherein at least one second layer pair of the second layer group is arranged between the third layer group and the fourth layer group. The fourth layer group should have a fourth period thickness P4 for which the same conditions as for the third period thickness P3 analogously hold true. In particular, therefore, $P4=P_M\pm\Delta P$ holds true, wherein preferably $\Delta P=x*(\lambda/(N4\cos(AOI_M)))$ where $0.2\leq x\leq 0.35$ holds true.

The fourth layer group can be understood as a further phase shifting layer group which is still inserted, at a distance from the third layer group, within the second layer group near the substrate.

The layer construction of the fourth layer group can be identical to the layer construction of the third layer group or deviate therefrom.

It is possible for the fourth layer group to consist only of a single layer pair, such that N4=1. The fourth number N4 should preferably be in the range of 2 to 5, in particular 2 or 3, such that the fourth layer group also acts as a phase shifting layer group without being greatly absorbent.

The fourth layer group can have a periodic layer construction, in particular a strictly periodic layer construction.

The first and second layer groups can be constructed using different layer material combinations and can have different period thicknesses, such that $P1\neq P2$ is possible. Particularly simple production results if the first period thickness P1 is equal to the second period thickness P2, such that the mean period thickness is equal to the first period thickness or the second period thickness. Such a multilayer arrangement can be described as a so-called "monostack" with inserted third layer group and, if appropriate, additionally also inserted fourth layer group.

In some embodiments, a further simplification of production whilst maintaining the advantageous optical properties arises by virtue of the fact that a layer thickness of the relatively high refractive index layer material or of the relatively low refractive index layer material is substantially identical in all layer pairs of the first layer group, of the second layer group and of the third layer group. If a fourth layer group is present, this can also hold true for the fourth layer group. This results in advantages in terms of production engineering since different layer thicknesses do not have to be "hit" for one of the layer materials of a layer pair. It can therefore be the case that one of the layer materials of the layer pairs in all layer groups has the same layer thickness. It is then necessary to vary, if appropriate, only the layer thickness of the other layer material for producing the third layer group and/or the fourth layer group.

In many embodiments, the layer pairs of a layer group are constructed strictly periodically. In the case of a periodic layer group which is not strictly periodic, the ratio between the layer thickness of the more highly absorbent layer material (Mo in the case of Mo/Si layer pairs) and the period thickness of the layer pair is designated by the parameter $\Gamma$. In the case of a strictly periodic layer group, the value of $\Gamma$ is constant in the layer pairs of a layer group. This condition can hold true for one of the layer groups, for a plurality of the layer groups or for all the layer groups of a multilayer arrangement. As a result, production becomes simple since only a few layer thicknesses have to be "hit".

There are also embodiments in which the ratio $\Gamma$ between the layer thickness of the more highly absorbent layer material (absorber) and the period thickness of the layer pairs within at least one of the layer groups varies. In this case, a stochastic variation is preferably avoided by virtue of the fact that the value of $\Gamma$ varies continuously within a layer group. The value of $\Gamma$ can increase or decrease from layer pair to layer pair from the substrate side of a layer group to that side of the layer group which lies nearer to the radiation entrance side.

These conditions can hold true for one of the layer groups, for a plurality of the layer groups or for all the layer groups of a multilayer arrangement. This results in further degrees of freedom of design.

The invention also relates to an optical system comprising at least one EUV mirror of the type described in greater detail above or below.

The optical system can be e.g. a projection lens or an illumination system for a microlithographic projection exposure apparatus operating with EUV radiation. The EUV mirror can have a planar mirror surface or a convexly or concavely curved mirror surface. In a projection lens, e.g. the mirror at which the largest angle-of-incidence interval occurs can be constructed as described here, if appropriate also a plurality or all of the EUV mirrors. The EUV mirror can be a uniaxially or multiaxially tiltable individual mirror of a controllable multi-mirror array (MMA) at which different angle-of-incidence intervals can occur depending on the tilting position. A broadband effect can be particularly advantageous here. A multi-mirror array can have a plurality of EUV mirrors of the type described here. EUV mirrors can also be used in other optical systems, e.g. in the field of microscopy.

These and further features emerge not only from the claims but also from the description and the drawings, wherein the individual features can be realized in each case by themselves or as a plurality in the form of subcombinations in an embodiment of the invention and in other fields and can constitute advantageous and inherently protectable embodiments. Exemplary embodiments of the invention are illustrated in the drawings and are explained in greater detail below.

DETAILED DESCRIPTION

Aspects of the invention are explained below on the basis of the example of a plurality of exemplary embodiments of EUV mirrors which are designed for an EUV operating wavelength of $\lambda=13.5$ nm and for angles of incidence from the interval $10° \leq AOI \leq 17.5°$, that is to say for a mean angle of incidence $AOI_M=13.75°$. In this case, the angle of incidence (AOI) denotes the angle formed by a ray impinging on the mirror surface relative to the normal N to the surface of the mirror at the impingement point. Angle-of-incidence intervals of this type can occur for example in optical systems for EUV microlithography which operate with a high numerical aperture.

In the case of such angles of incidence, as is known, multilayer mirrors having a multilayer arrangement having a reflective effect for the EUV radiation are used which contain a large number of layer pairs (bilayers) having alternately applied layers of a layer material having a higher real part of the refractive index (also called "spacer") and a layer material having relative thereto a lower real part of the refractive index (also called "absorber"). Layer pairs can be constructed e.g. with the layer material combinations molybdenum/silicon (Mo/Si) and/or ruthenium/silicon (Ru/Si). In this case, silicon respectively forms the spacer material, while Mo and/or Ru serve as absorber material. A layer pair can contain at least one further layer, in particular an interposed barrier layer, which can consist e.g. of C, $B_4C$, $Si_xN_y$, SiC or a composition comprising one of said materials and is intended to prevent interdiffusion at the interface.

The exemplary embodiments explained below are intended to serve for illustrating some basic principles. Molybdenum (Mo) and silicon (Si) are used in each case as layer materials, thus resulting in a clear explanation. The basic principles can also be used for other wavelengths, other angle-of-incidence intervals and/or other layer material combinations. Moreover, the basic principles act independently of the use of barrier layers and/or protective layers which can additionally be provided in a layer stack.

Figure 1:
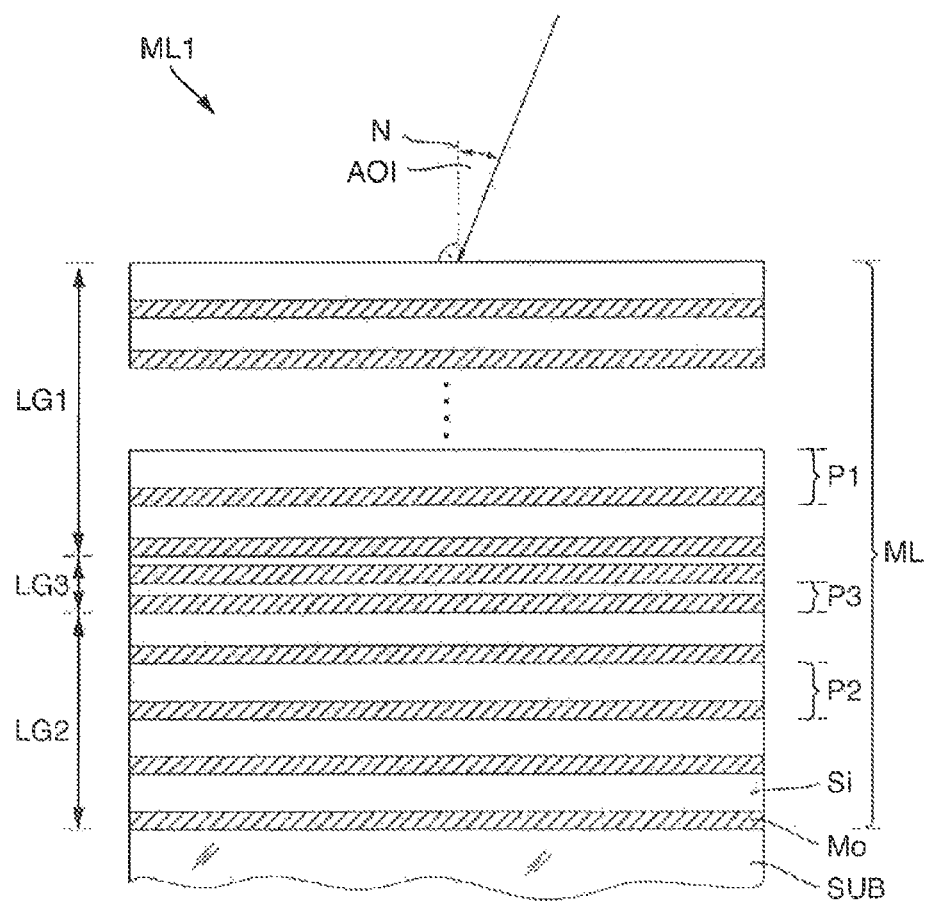
FIG. 1 shows a schematic vertical section through the layer structure of a multilayer arrangement in accordance with a first exemplary embodiment.

FIG. 1 shows a schematic vertical section through the layer structure of a multilayer arrangement ML in accordance with a first exemplary embodiment.

Figure 2:
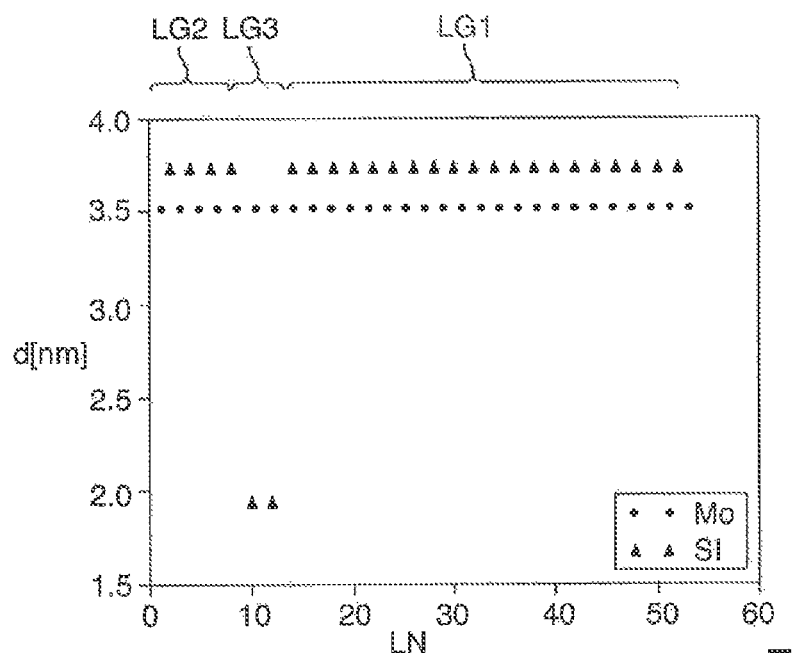
FIG. 2 shows a layer thickness diagram of the first exemplary embodiment.

FIG. 2 shows an associated layer thickness diagram, wherein the layer number LN of the individual layers is indicated on the abscissa and their geometrical layer thickness d in [nm] is indicated on the ordinate. The dotted symbols represent individual layers composed of molybdenum, while the triangle symbols represent individual layers composed of silicon. The substrate (not illustrated) is situated on the left-hand side, such that the individual layer having the layer number 1 directly adjoins the substrate. The radiation entrance side accordingly lies on the right at the highest layer number. This manner of illustration applies to all the layer thickness diagrams in this application.

Figure 3:
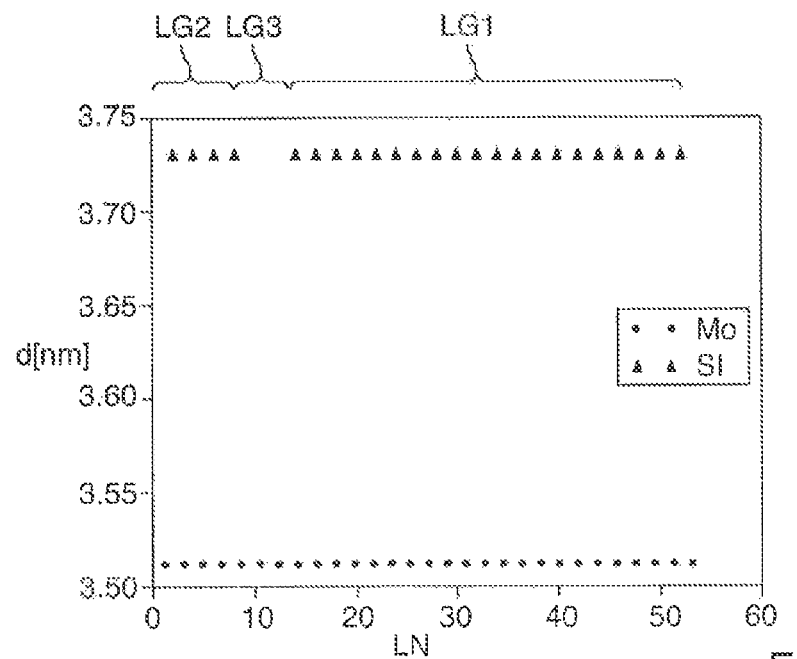
FIG. 3 shows a layer thickness diagram of a reference mirror, the multilayer arrangement of which is embodied as a pure Mo/Si monostack.

FIG. 3 shows a layer thickness diagram of a reference mirror REF used for comparison purposes, the multilayer arrangement of said reference mirror being embodied as a pure Mo/Si monostack. The term "monostack" here denotes a multilayer arrangement in which all successive layer pairs have the same layer material combination and the same individual layer thicknesses.

The EUV mirror from FIG. 1 has a substrate SUB having a substrate surface processed with optical precision, on which substrate surface a multilayer arrangement ML is applied, which is also designated hereinafter as "multilayer". In the example, the multilayer arrangement consists of 52 individual layers, wherein molybdenum layers (hatched) and silicon layers (without hatching) alternate. As a result, 26 Mo/Si layer pairs are formed, which are also designated as Mo/Si bilayers.

The individual layers or layer pairs can be subdivided into three respectively periodic layer groups arranged one above another and having different functions. Situated at the radiation entrance side there is a periodic first layer group LG1 having a first number $N1=20$ of Mo/Si layer pairs, which are also designated as first layer pairs. Situated in the manner directly adjoining the substrate SUB there is a periodic second layer group LG2 having a second number $N2=4$ of directly adjacent Mo/Si layer pairs, which are also designated as second layer pairs. The first period thickness P1 of the layer pairs of the entrance-side first layer group and the second period thickness P2 of the second layer pairs of the second layer group LG2 are in each case identical. "Period thickness" here designates the sum of the optical layer thicknesses of the individual layers of a layer pair, wherein the optical layer thickness is in each case the product of the geometrical layer thickness d and the refractive index of the respective layer material.

The third layer group LG3, which is arranged between the first layer group LG1 and the second layer group LG2, likewise has a periodic layer construction, but with only $N3=2$ Mo/Si layer pairs (third layer pairs). The third layer group LG3 has a third period thickness P3 which deviates significantly from the period thicknesses of the first and second layer groups. In the case of the example, the third period thickness is significantly less than the first or second period thickness. This is caused by the fact that the two Si layers (layer numbers 10 and 12) have a significantly smaller layer thickness than the Si layers of the first and second layer groups.

The difference in the period thickness between the mean value $P_M=(P1+P2/2)$ of the period thicknesses of the first and second layer groups and the period thickness of the third layer group is designated as the period thickness difference $\Delta P$, which has a negative sign in the case of the example ($P3=P_M-\Delta P$). The period thickness difference $\Delta P$ is intended substantially to correspond to the quotient of the optical layer thickness of a λ/4 layer and the third number N3. The third layer group then introduces overall the layer thickness of a quarter-wave layer between the first and second layer groups, but this layer thickness is distributed among a plurality of individual layers.

In the example the following relations hold true: $P1=P2=P_M=6.69$ nm; $P3=5.17$ nm$=P_M-1.79$ nm; $N3=2$. Therefore, $x=1.79$ nm$^*\cos(AOI_M)/\lambda^*N3=0.248$.

The third layer group has only two layer pairs having the period thickness P3 deviating from the rest of the layer stack. The contribution of the third layer group to the reflectivity of the entire multilayer is very small in comparison with the contribution of the first layer group LG near the surface, and also significantly smaller than the contribution of the second layer group LG2 near the substrate. On account of the deviating period thickness, the third layer group has hardly any reflective effect for the wavelength and the angle-of-incidence range and absorbs only little radiation on account of the small number of layers. One important effect of the third layer group LG3 is that the third layer group produces a phase shift between the phases of the partial beams reflected within the second layer group and the partial beams reflected within the first layer group.

Figure 4:
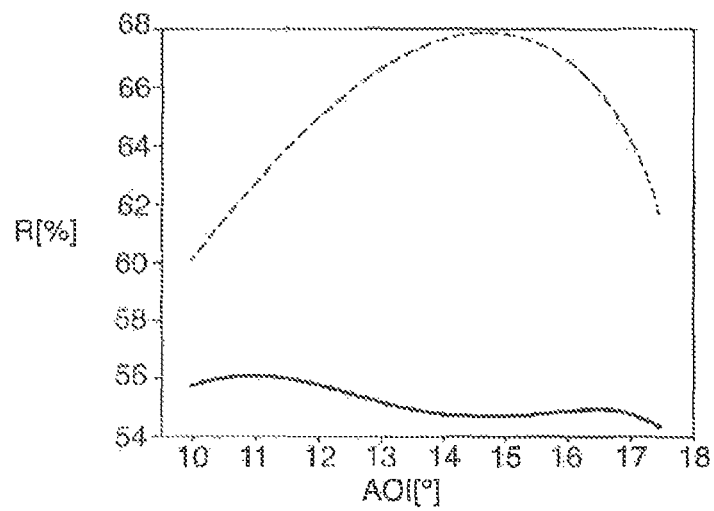
FIG. 4 shows a comparison diagram concerning the angle-of-incidence dependence of the reflectivity of an Mo/Si monostack (MS) and of the first exemplary embodiment.

The effect of this phase shift produced by the third layer group LG3 will be explained with reference to FIG. 4. FIG. 4 shows a comparison diagram illustrating the reflection coefficient R[%] of an EUV mirror as a function of the angle of incidence AOI. The dashed curve having a maximum reflection coefficient of approximately 68% at AOI≈15° shows the angle-of-incidence dependence of the reflectivity of the pure monostack from FIG. 3. The solid line shows the corresponding reflectivity profile in the case of the first exemplary embodiment (FIG. 2), which contains a phase shifting third layer group between the entrance-side first layer group and the substrate-side second layer group. It is immediately evident that the maximum reflectivity in the case of the pure monostack with a value of 68% is significantly higher than the reflectivity occurring at the same angle of incidence in the case of the first exemplary embodiment. However, the variation of the reflectivity over the angle-of-incidence range is significantly smaller in the case of the first exemplary embodiment than in the case of the pure monostack. While the reflectance varies between approximately 60% (at 10°) and approximately 68% (at approximately 15°), that is to say by approximately 8% points, in the case of the reference system, the reflectance in the same angle-of-incidence interval in the case of the exemplary embodiment varies only by approximately 2% points, to be precise between approximately 54% (at approximately 17°) and 56% (at approximately 11°). It can be seen that the phase shift produced by the third layer group leads to a significant homogenization of the angle-of-incidence dependence of the reflectivity in the selected angle-of-incidence range for which the multilayer arrangement is designed.

Figure 5:
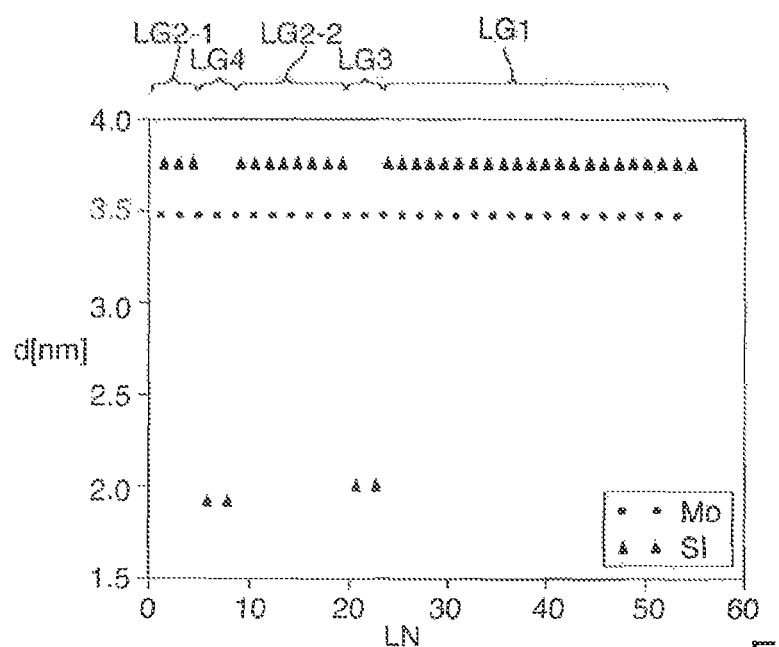
FIG. 5 shows a layer thickness diagram of the second exemplary embodiment.

FIG. 5 shows the layer thickness diagram of a second exemplary embodiment. The multilayer arrangement is constructed with Mo/Si layer pairs which can be subdivided into four layer groups. The first layer group LG1, adjoining the radiation entrance side, has N1=21 Mo/Si layer pairs having a period thickness P1. Toward the substrate side there follows a third layer group LG3 having two layer pairs (N2=2), in each of which the Si layer has a significantly smaller layer thickness than the Si layers of the first layer group. This results in a period thickness P3<P1 for the third layer group. Situated between the third layer group LG3 and the substrate there is a second layer group LG2 having 11 Mo/Si layer pairs, the period thickness P2 of which is equal to the period thickness P1 of the layer pairs of the first layer group LG1. In the region of the second layer group LG2, at a distance from the substrate, a fourth layer group LG4 having two directly adjacent Mo/Si layer pairs (layer numbers 7-10) is also inserted, such that N4=2. The fourth layer group subdivides the second layer group LG2 into two subgroups. A first subgroup LG2-1 having three Mo/Si layer pairs directly adjoins the substrate, while a second subgroup LG2-2 having eight layer pairs is arranged between the third layer group and the fourth layer group.

The third layer group LG3 and the fourth layer group LG4 in each case have a significantly smaller period thickness P3 and P4, respectively, than the first layer group LG1 and the second layer group LG2, respectively. The following conditions approximately hold true: $P3=P_M-\Delta P$ where $\Delta P \approx (\lambda/4)/\cos(AOI_M)N3)$ and $P4=P_M-\Delta P$ where $\Delta P \approx (\lambda/4)/\cos(AOI_M)N4)$.

The third layer group LG3 introduces a phase shift between the partial beams reflected by the second layer group LG2 and the partial beams reflected by the first layer group LG1. The fourth layer group LG4 brings about a corresponding phase shift between those partial beams which are reflected on the one hand by the first subgroup LG2-1, nearer the substrate, and on the other hand by the second subgroup LG2-2, more remote from the substrate, of the second layer group. The third and fourth layer groups form two mutually independently active phase shifting layer groups arranged at different locations at a distance from one another in the layer stack.

Figure 9:
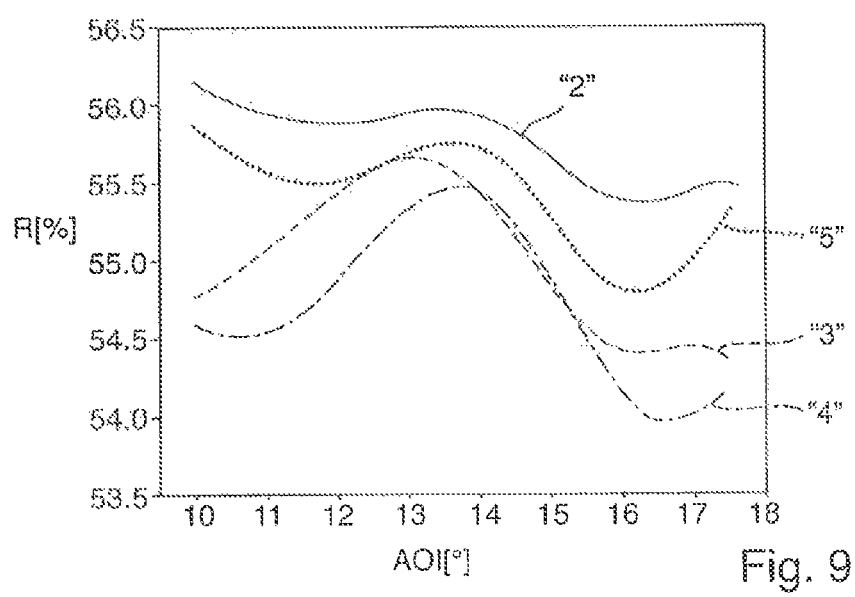
FIG. 9 shows the angle-of-incidence dependence of the reflectivity of the second to fifth exemplary embodiments.

The reflectivity profile obtained in the angle-of-incidence range between 10° and 17.5° is shown by reflectivity curve "2" in FIG. 9. The reflectivity varies between a maximum value $R_{MAX}=56.2\%$ and a minimum value $R_{MIN}=55.4\%$, that is to say by less than 1% point. A homogenization of the dependence of the reflectivity on the angle of incidence can therefore be achieved with the aid of a second phase shifting layer group. At the same time, none of the Si individual layers is thicker than the Si individual layers in the first or second layer group, with the result that, in particular, layer thicknesses of individual layers in the vicinity of $\lambda/(2^*\cos(AOI_M))$ (corresponding to approximately 6.7 nm) or more are avoided.

Figure 6:
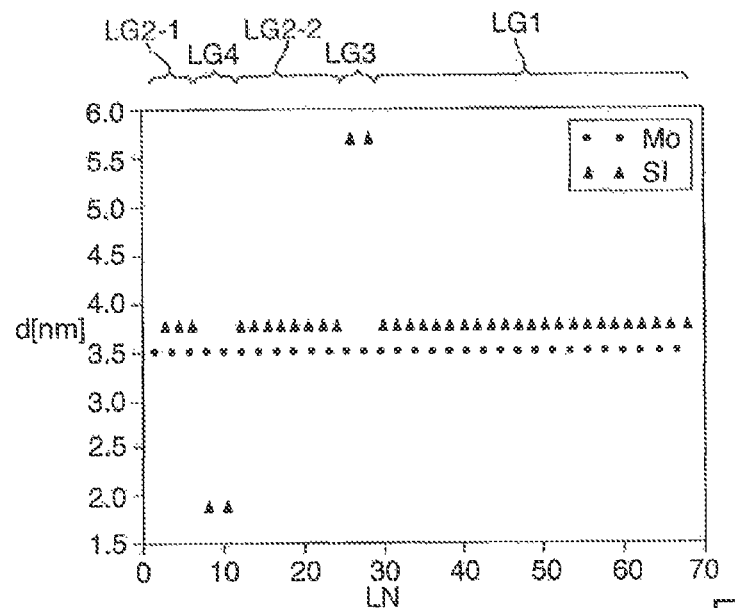
FIG. 6 shows a layer thickness diagram of the third exemplary embodiment.

Numerous further variants are possible. In the case of the third exemplary embodiment in FIG. 6 as well, two phase shifting layer groups arranged at a distance from one another are inserted into a multilayer arrangement which otherwise consists of Mo/Si layer pairs of uniform period thickness (P1=P2). The multilayer arrangement has an entrance-side first layer group LG1 having N1=20 layer pairs and a substrate-side second layer group LG2 having N2=10 layer pairs. A third layer group LG3 having N3=2 layer pairs (layer numbers 25-28) is inserted between the first and second layer groups. Within the second layer group, a fourth layer group LG4 having two layer pairs (layer numbers 7-10) is inserted, which subdivides the second layer group into a substrate-side first subgroup LG2-1 having three layer pairs and a second subgroup LG2-2 having seven layer pairs, said second subgroup lying between the fourth layer group and the third layer group.

As in the case of the exemplary embodiment in FIG. 5, the fourth layer group LG4 has a fourth period thickness P4 which is less than the period thickness of the layer pairs of the second layer group and of the first layer group. By contrast, the third layer group LG3 has a period thickness P3 which is greater than the period thicknesses P1 of the first layer group and P2 of the second layer group by a period thickness difference ΔP. At the same time, the multilayered periodic construction of the third layer group LG3 ensures that none of the individual layers of the third layer group has a layer thickness of the order of magnitude of $\lambda/(2*\cos(AOI_M))$ or more. The two Si individual layers of the third layer group each have a geometrical layer thickness d≈5.7 nm. Therefore, the optical layer thickness of said individual layers is at least 10% less than the layer thickness of a $\lambda/(2*\cos(AOI_M))$ layer.

It is evident from the reflectivity curve "3" in FIG. 9 that the reflectivity of this multilayer arrangement in the chosen angle-of-incidence range varies between a maximum value of approximately 55.7% at AOI=13° and a minimum value of approximately 54.4% at AOI=17.5°, that is to say by less than 1.5% points.

Figure 7:
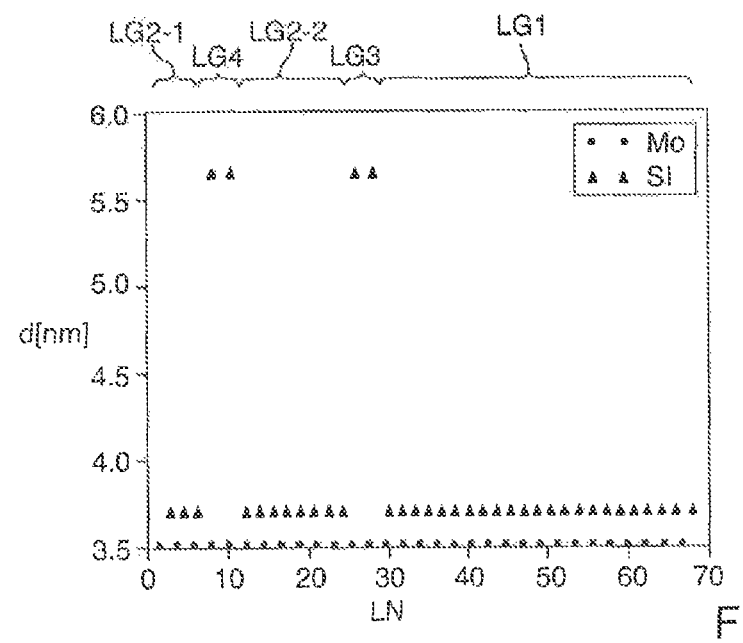
FIG. 7 shows a layer thickness diagram of the fourth exemplary embodiment.

FIG. 7 shows the layer thickness diagram of a fourth exemplary embodiment. The designation of the individual layer groups corresponds to that in the other exemplary embodiments. The entrance-side first layer group LG1 has N1=20 layer pairs, while the substrate-side second layer group LG2 has a total of N2=10 layer pairs, which is subdivided into two subgroups (substrate-side subgroup LG2-1 and subgroup LG2-2 more remote from the substrate). The third layer group LG3 is situated between the first layer group LG1 and the second layer group LG2, while a fourth layer group LG4 subdivides the second layer group into the two subgroups mentioned.

The third and fourth layer groups LG3 and LG4, respectively, in each case consist of two directly adjacent Mo/Si layer pairs (N2=2, N4=2), wherein the layer thicknesses of the Mo layers correspond in each case to the layer thickness of the Mo layers in the first and third layer groups, while the layer thicknesses of the Si layers are in each case greater than the layer thicknesses of the Si layers of the first and second layer groups. It is evident from this that the third period thickness P3 and the fourth period thickness P4 are greater than the mean period thickness of the first and second layer groups in each case by a period thickness difference ΔP. Both the third layer group LG3 and the fourth layer group LG4 act optically as a phase shifting layer group, without making a substantial contribution to the reflectivity. Although the layer thicknesses of the Si layers of the third and fourth layer groups are greater than those in the first and second layer groups, they are significantly (more than 10%) below the layer thickness of a $\lambda/(2*\cos(AOI_M))$ layer. As a result, they are readily controllable in terms of production engineering.

The homogenizing effect on the angle-of-incidence dependence of the reflectivity becomes clear from the curve "4" in FIG. 9. The reflectivity varies between a maximum value $R_{MAX}$ of approximately 55.5% at 13.5° and a minimum value $R_{MIN}$ of approximately 54.0% at approximately 16.8°, that is to say by less than 2% points.

Figure 8:
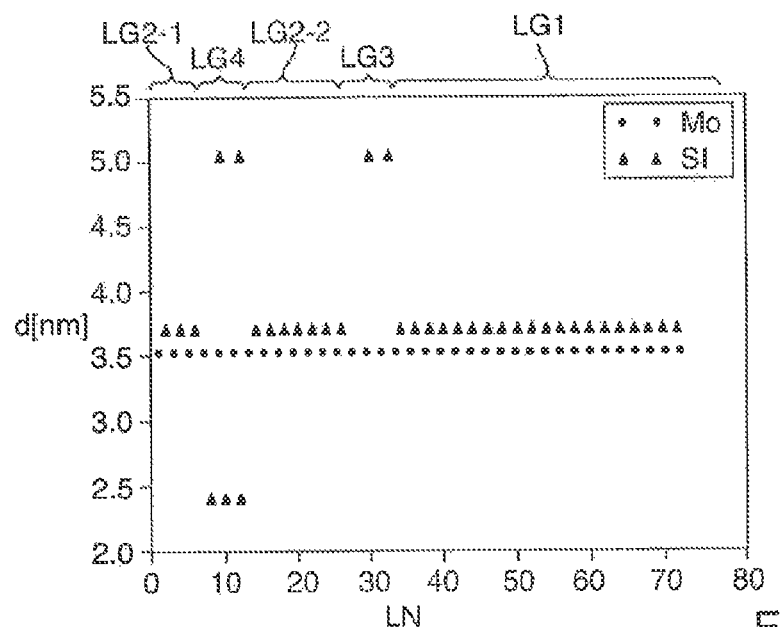
FIG. 8 shows a layer thickness diagram of the fifth exemplary embodiment.

FIG. 8 shows the layer thickness diagram of a fifth exemplary embodiment. The individual layer groups (first to fourth layer groups) bear the same designations as in the second and third exemplary embodiments. It holds true that: N1=20, N2=10, N3=3, N4=3. All the individual layers composed of molybdenum have substantially the same layer thickness in all the layer groups. In the first and second layer groups, the layer thickness of the Si layer is the same in each case, such that P1=P2 also holds true. In the third layer group LG3, which is arranged between the first layer group and the second layer group, the Si individual layers are thicker than in the first and second layer groups, thus resulting in a third period thickness P3 which is greater than the mean period thickness $P_M$=P1=P2 by a period thickness difference ΔP, wherein the period thickness difference ΔP substantially corresponds to the quotient of the optical layer thickness (λ/4) of a quarter-wave layer and the third number N3. In the fourth layer group LG4, by contrast, the Si individual layers are thinner than in the first and second layer groups, as a result of which the fourth period thickness P4 is less than the mean period thickness by a period thickness difference ΔP, wherein the period thickness difference ΔP substantially corresponds to the quotient of the optical layer thickness (λ/4) of a quarter-wave layer and the fourth number N4. Here, too, the essential optical function of the second and third layer groups consists in bringing about a phase shift between those partial beams which are reflected in the substrate-side layers and respectively the layers remote from the substrate to the respective phase shifting layer group. As shown by the curve "5" in FIG. 9, in the entire angle-of-incidence range around the mean angle of incidence $AOI_M$≈13.3° this results in a small reflectivity variation between a maximum value of approximately 55.8% (at 10°) and 54.8% at an angle of incidence of approximately 16.3°.

As shown by the reflectivity curves R=f(AOI) in FIGS. 4 and 9, it holds true for all the exemplary embodiments that the dependence of the reflectivity R on the angle of incidence AOI in an angle-of-incidence range of approximately ±3.5° around a mean angle of incidence (at approximately 13.3°) is relatively small. For all the examples, the condition ΔR<3%, in particular ΔR<2%, holds true for the relative variation $\Delta R=(R_{MAX}-R_{MIN})/R_{MAX}$ of the reflectivity.

In all the exemplary embodiments shown here by way of example, the individual layers composed of molybdenum have substantially the same layer thickness in all the layer groups, such that only the layer thicknesses of the Si individual layers are varied. The uniform layer thickness for a layer material within the layer pairs simplifies production, but is not mandatory in principle. It is also possible for the layer thicknesses of both layer materials of the layer pairs to vary within the layer groups or from layer group to layer group in a range outside the production tolerances.

In all the exemplary embodiments, the third layer group or the third and fourth layer groups in each case introduce(s) a changed layer thickness between the adjacent layer groups, the change corresponding to the layer thickness of a λ/4 layer, but the total layer thickness of said λ/4 layer is distributed among a plurality of individual layers of the third and/or fourth layer group(s). Problematically large layer thicknesses of individual layers are thereby avoided.

In the exemplary embodiments shown hereinbefore, the layer thickness of the Mo layers is in each case constant in all the layer groups, while the layer thickness of the Si layers varies. It is also possible for the layer thicknesses of the Mo layers to vary and the layer thicknesses of the Si layers to be substantially constant, or for both the layer thicknesses of the Mo layers and of the Si layers to vary within the layer groups or between individual layer groups. In the context of the novel layer designs, therefore, there is great freedom of configuration with regard to the layer thicknesses, such that an optimum layer thickness can be found and produced for each layer material.

In the exemplary embodiments shown hereinbefore, the layer thickness of the more highly absorbent layer material (Mo in the case of Mo/Si) is in each case constant within a layer group (first, second, third and, if appropriate, fourth layer group). This affords advantages in terms of production engineering, inter alia, but is not mandatory. Exemplary embodiments are explained below in which the ratio Γ between the layer thickness of the more highly absorbent layer material (Mo) and the period thickness of the layer pairs of a layer group varies significantly within a layer group.

Figure 10:
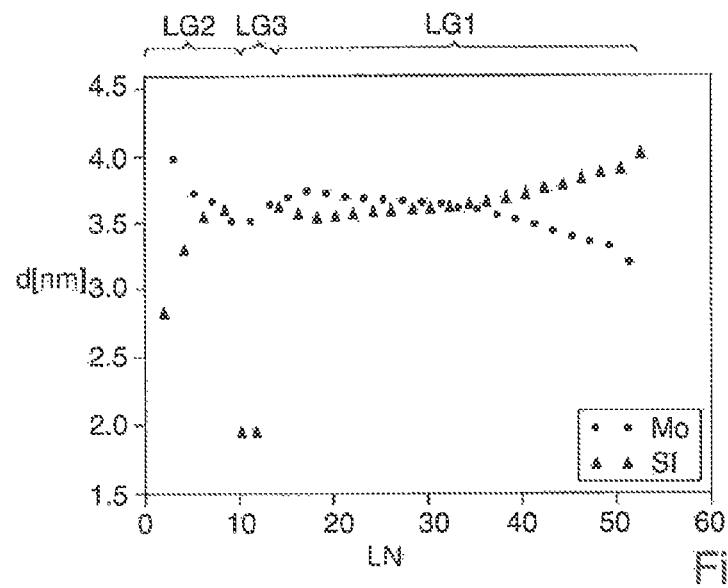
FIG. 10 shows a layer thickness diagram of the sixth exemplary embodiment.
Figure 11:
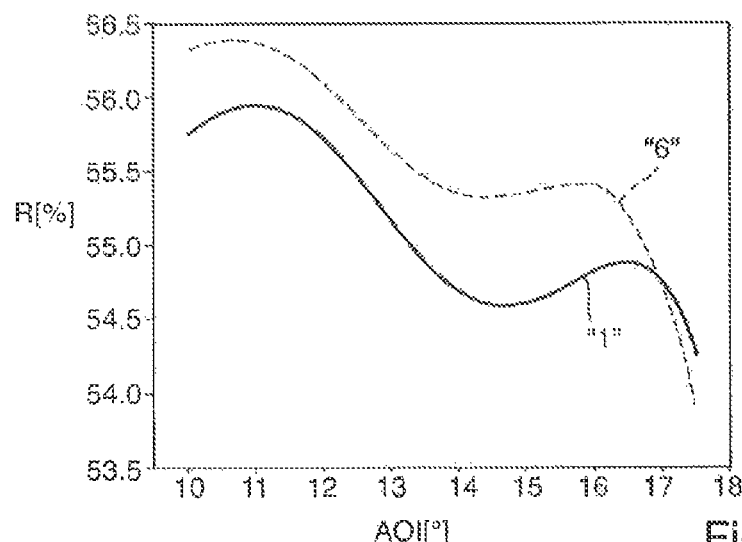
FIG. 11 shows the angle-of-incidence dependence of the reflectivities of the sixth exemplary embodiment ("6") and of the first exemplary embodiment ("1")

In this respect, FIG. 10 shows the layer thickness diagram of a sixth exemplary embodiment. FIG. 11 shows a comparison of the angle-of-incidence dependence of the reflectivity of the sixth exemplary embodiment (dashed curve "6") relative to the corresponding values of the first exemplary embodiment ("1") from FIG. 2. In the second layer group LG2 adjoining the substrate, the Mo layer thickness decreases from the substrate toward the radiation entrance side from approximately 4.5 nm to approximately 3.7 nm, while at the same time the Si layer thickness increases to a corresponding extent, such that the period thickness P2 of all the layer pairs of the second layer group remains substantially constant. The following third layer group LG3 has N3=2 layer pairs in which the Mo layer thickness is significantly greater than the Si layer thickness. The Γ value is constant here, however. Within the entrance-side first layer group LG1, the Mo layer thickness and the Si layer thickness likewise vary continuously by virtue of the fact that the Mo layer thickness firstly increases somewhat and then decreases continuously over more than 15 layer pairs, the nearer the layer pairs are to the radiation entrance side. The Si layer thickness exhibits a complementary profile, such that the period thickness P1 is constant in the first layer group LG1. The layer thickness profile in the first layer group LG1 takes account, inter alia, of the fact that it can be advantageous to minimize the layer thicknesses of the more highly absorbent Mo at the radiation entrance side in comparison with the more weakly absorbent Si.

The reflectivity profile shown in FIG. 11 shows that, in the angle-of-incidence interval between approximately 10° and 17.5°, the reflectivity varies between a maximum value of 56.4% and a minimum value of 54% by less than 3 percentage points. The absolute reflectivities are somewhat above the values of the first exemplary embodiment.

Figure 12:
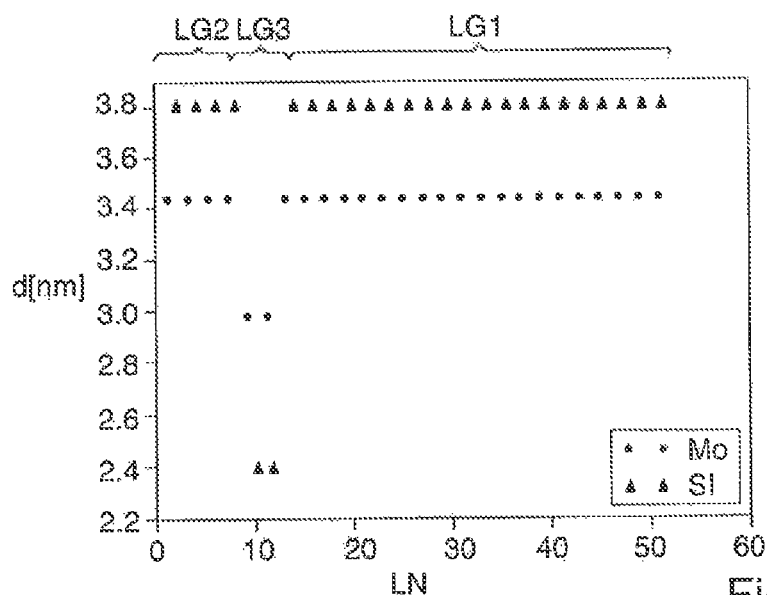
FIG. 12 shows a layer thickness diagram of the seventh exemplary embodiment.

FIG. 12 shows a seventh exemplary embodiment, which demonstrates that the phase shifting effect of the interposed third layer group LG3 can be divided between both layer materials (Mo and Si). In the previous exemplary embodiments, only the layer thickness of one of the layer materials was ever varied in order to produce the third layer group proceeding from the adjacent layer groups. It is also possible for the layer thicknesses of both layer materials within the third layer group to deviate from the corresponding layer thicknesses in the adjacent first and second layer groups.

Figure 13:
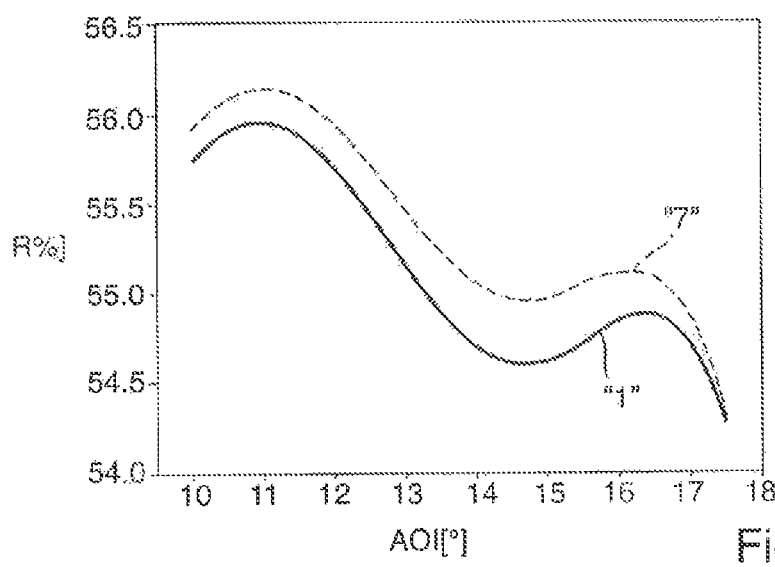
FIG. 13 shows the angle-of-incidence dependence of the reflectivities of the seventh exemplary embodiment ("7") and of the first exemplary embodiment ("1")

In this seventh exemplary embodiment, a third layer group LG3 consisting of two layer pairs comprising two Mo/Si layer pairs is interposed between the second layer group LG2 near the substrate and the entrance-side first layer group LG1. The layer thicknesses of the Mo layers and of the Si layers within the third layer group are less than the layer thicknesses of the corresponding layer materials in the first layer group and the second layer group, respectively. FIG. 13 shows the associated reflectivity diagram, wherein the reflectivity curve "7" associated with the seventh exemplary embodiment is illustrated by a dashed line and, for comparison, the reflectivity curve ("1") associated with the first exemplary embodiment is illustrated by a solid line. With a similar general profile, the reflectivities of the seventh exemplary embodiment lie approximately 0.2 to 0.3 percentage points above the comparison example, and the variation of the reflectivity within the angle-of-incidence interval under consideration is approximately 2 percentage points.

Properties of an eighth exemplary embodiment are explained with reference to FIGS. 14 (layer thickness diagram), 15 (angle-of-incidence dependence of the reflectivity) and 16 (period thickness diagram). This multilayer arrangement is designed for λ=13.5 nm and an angle-of-incidence range of approximately 5.6° to approximately 19°. In this exemplary embodiment, a layer pair also has, in addition to the individual layers composed of Si and Mo, interposed barrier layers composed of boron carbide (each 0.4 nm $B_4C$), in order to reduce the interdiffusion between Mo and Si. Consequently, a "layer pair" here consists of four individual layers Si, $B_4C$, Mo, $B_4C$.

Situated between the substrate and the second layer group LG2 near the substrate, there are two individual layers which form no period and form an intermediate layer between the substrate and the multilayer arrangement. A multilayered cap layer comprising individual layers composed of ruthenium (Ru), molybdenum (Mo) and silicon (Si) is provided on the radiation entrance side. The four individual layers on the entrance side are likewise not considered any further here.

The multilayer arrangement has a radiation-side first layer group LG1 having N1=19 Mo/Si layer pairs, a second layer group LG2 near the substrate and having N2=10 Mo/Si layer pairs, a third layer group LG3 arranged between the first layer group and the second layer group and having N3=6 Mo/Si layer pairs, and a fourth layer group LG4, which likewise has N4=6 Mo/Si layer pairs.

The fourth layer group is inserted within the second layer group between the third layer group and the substrate in such a way that a substrate-side first subgroup LG2-1 of the second layer group has three layer pairs and a second subgroup LG2-2 having seven layer pairs of the second layer group lies between the third and fourth layer groups.

Within the first layer group LG1, the layer thickness of the more highly absorbent Mo decreases continuously from the third layer group to the radiation entrance side, while the Si layer thicknesses increase toward the radiation entrance side in a complementary manner. Within the first layer group, this results in a constant period thickness P1 having a Γ value decreasing continuously from the third layer group toward the radiation entrance side.

In the second layer group LG2, the Γ value likewise varies from layer group to layer group, wherein the Γ value near the fourth layer group LG4 has the lowest value and the Mo layer thickness proceeding from the fourth layer group increases continuously in each case in both directions. The layer thicknesses of Si have a complementary profile, such that for the second layer group LG2, too, there is a constant period thickness P2 in all the layer groups. Special features of the layer thickness profiles in the third and fourth layer groups will be explained in greater detail in connection with FIG. 16.

Figure 15:
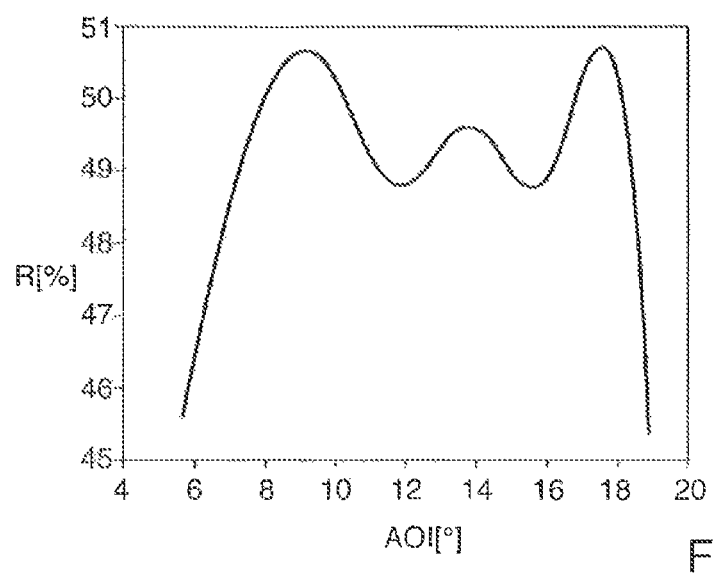
FIG. 15 shows the angle-of-incidence dependence of the reflectivity of the eighth exemplary embodiment.

FIG. 15 shows the reflectivity profile of the eighth exemplary embodiment as a function of the angle of incidence and demonstrates that the reflectivity varies by less than 2 percentage points in the angle-of-incidence range between approximately 7° and approximately 18.5°.

Figure 16:
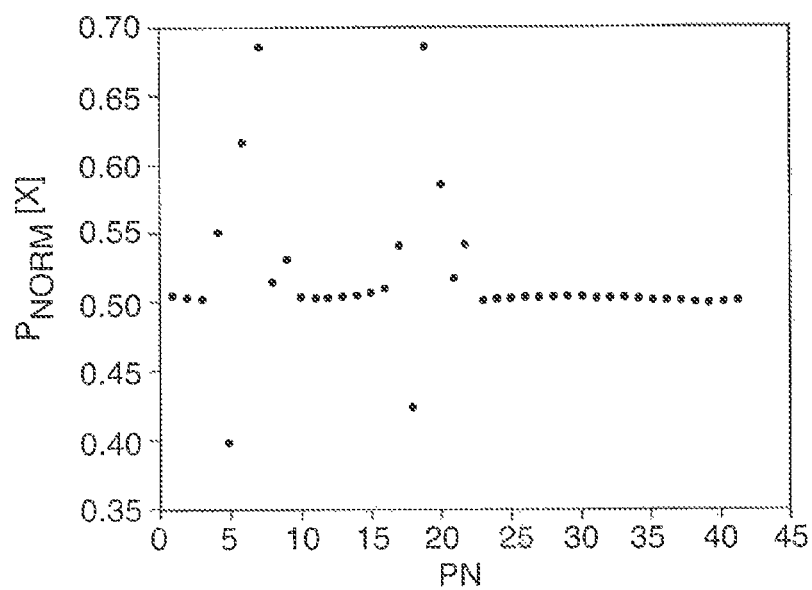
FIG. 16 shows a diagram for illustrating the period thicknesses within the eighth exemplary embodiment.

For illustrating the period thicknesses of the individual layer groups, FIG. 16 shows the numbers PN of the successive layer pairs on the abscissa and the values for a normalized period thickness $P_{NORM}$ on the ordinate, said normalized period thickness being calculated by the actual period thicknesses being multiplied by the factor $\cos(AOI_M)/\lambda$. The mean angle of incidence $AOI_M$ here is 12.3°, and the wavelength is 13.5 nm.

It can be seen that the period thicknesses P1 in the first layer group and the period thicknesses P2 of the layer pairs of the second layer group L2 are in each case close to $P_{NORM}$=0.5. It can also be seen that the nominated period thicknesses within the third layer group LG3 and within the fourth layer group LG4 vary from layer pair to layer pair. However, the mean value of the period thicknesses within the third and fourth layer groups fulfils the condition $P3=P_M\pm\Delta P$ where $\Delta P=x*(\lambda/(N3\ \cos(AOI_M)))$, wherein x=0.29 holds true. Each of the two inserted layer groups (third layer group and fourth layer group, respectively) thus includes an "additional λ/4 layer", the total layer thickness of which is distributed among a plurality of layers of the third layer group and of the fourth layer group, respectively. As in the other exemplary embodiments, the layer thicknesses of all layers within the third layer group and the fourth layer group are in each case less than $\lambda/(2*\cos(AOI_M))$, such that the production problems that possibly occur in the case of excessively thick individual layers, as mentioned in the introduction, can be avoided.

Figure 17:
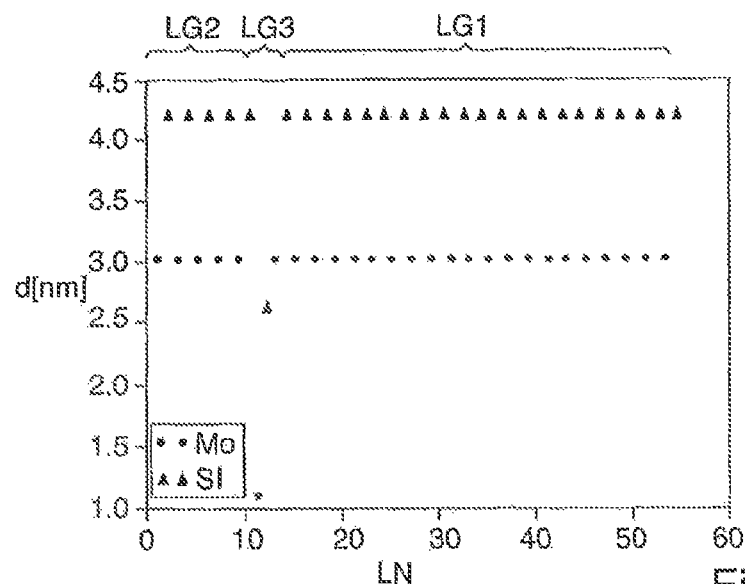
FIG. 17 shows a layer thickness diagram of the ninth exemplary embodiment.
Figure 18:
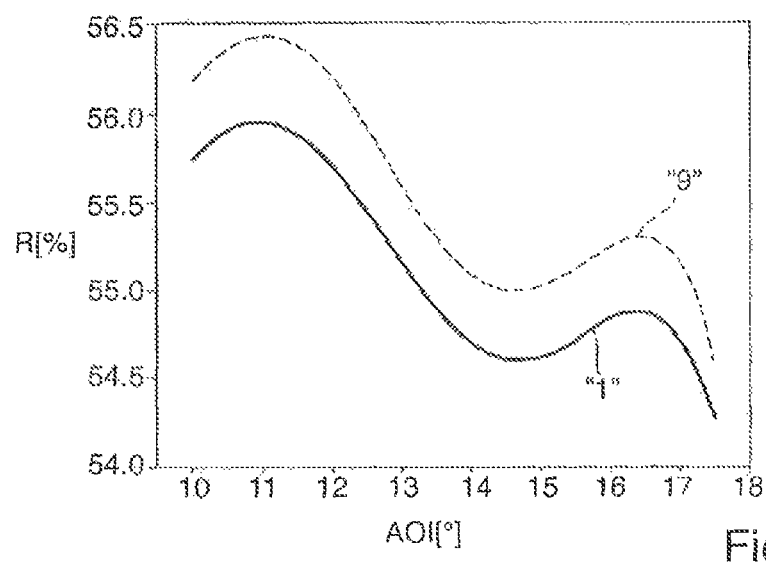
FIG. 18 shows the angle-of-incidence dependence of the reflectivity of the ninth exemplary embodiment.

In the case of the exemplary embodiments illustrated figuratively hereinbefore, the phase shifting third layer group has in each case a plurality of layer pairs. This is not mandatory, however. A ninth exemplary embodiment is explained with reference to FIGS. 17 to 18, only a single phase shifting layer group (third layer group) being present in this ninth exemplary embodiment, wherein the third layer group has only a single layer pair, such that N3=1 holds true. FIG. 17 shows the associated layer thickness diagram. FIG. 18 shows a comparison of the angle-of-incidence dependence of the reflectivity of this exemplary embodiment (dashed curve "9") relative to the corresponding values of the first exemplary embodiment ("1") from FIG. 2.

Situated at the radiation entrance side there is a periodic first layer group LG1 having a first number N1=21 of Mo/Si layer pairs (first layer pairs). Situated in a manner directly adjoining the substrate there is a second layer group LG2 in a second number N2=5 of directly adjacent Mo/Si layer pairs (second layer pairs). The period thicknesses P1 and P2 of the first and second layer groups, respectively, are identical.

Arranged between the first layer group LG1 and the second layer group LG2 there is a third layer group LG3, which has only a single Mo/Si layer pair (layer numbers 11 and 12). The third layer group has a period thickness P3 which is significantly less than the period thicknesses P1, P2 of the other two layer groups. In the case of the example it holds true that: $P1=P2=P_M$=6.96 nm; $P3$=3.52 nm=$P_M$−3.44, such that $\Delta P$=3.44 nm holds true. In accordance with the relationship $\Delta P=x*(\lambda/(N3\ \cos(AOI_M)))$ this results in $x=3.44*\cos(AOI_M)/\lambda*N3$=0.247.

In accordance with the formula $\Delta P=x*(\lambda/(N3\ \cos(AOI_M)))$, $\Delta P$ is dependent on N3. In the case of the example, N3=1. One possibility, therefore, would be to design a third layer group as an individual layer having a layer thickness of $\lambda/(2*\cos(AOI_M))$. However, the third layer group is not an individual layer, but rather a layer group having at least two individual layers, namely a layer composed of high refractive index material and a layer composed of low refractive index material. A phase shifting effect similar to the effect of an individual layer having a layer thickness $\lambda/(2*\cos(AOI_M))$ is obtained here by virtue of the required additional layer material being distributed between both individual layers of the layer pair. The phase shifting effect can be achieved, for example, if individual layer thicknesses of approximately $(\lambda/4+\lambda/8)/(\cos(AOI_M))$ are employed. It is also possible to provide thinner individual layer thicknesses, in particular $(\lambda/4-\lambda/8)/(\cos(AOI_M))$ (also see the relationship $P3=P_M\pm\Delta P$).

In the case of the example, the Si layer has a layer thickness of approximately 2.6 nm, while the Mo layer has a layer thickness of approximately 1 nm.

The reflectivity curve of the ninth exemplary embodiment shows that the reflectivity in the angle-of-incidence interval shown varies between a maximum value of approximately 56.4% at an angle of incidence of approximately 11° and a minimum value of approximately 54.6% at an angle of incidence of 17.5°, that is to say only by 2 percentage points. This is only slightly more than in the case of the reference system (curve "1").

In so far as concrete values for (geometrical or optical) layer thicknesses or ratios of layer thicknesses are indicated in this application, these indications refer to nominal layer thicknesses for defining a basic design of the multilayer arrangement. In the context of a reoptimization of such basic designs, design tolerances can lead to slight deviations from the nominal layer thicknesses. In the exemplary embodiments, design tolerances are generally in the range of ±15% or ±20% of the nominal layer thicknesses. The intention is also to encompass such multilayer arrangements in which the layer thicknesses of the individual layers and the period thicknesses of the individual layer groups, in the context of the design tolerances, deviate from the corresponding nominal values of the basic design. Corresponding design tolerances are also possible in the case of the period thickness difference $\Delta P$.

In addition, on the finished product, the EUV mirror, production tolerances can still lead to a slight variation of the layer thicknesses. Production tolerances per individual layer should generally be in the range of 5% or a maximum of 10% of the absolute layer thickness of the individual layer.

EUV mirrors of the type described in this application can be used in various optical systems, e.g. in the field of EUV microlithography.

Figure 19:
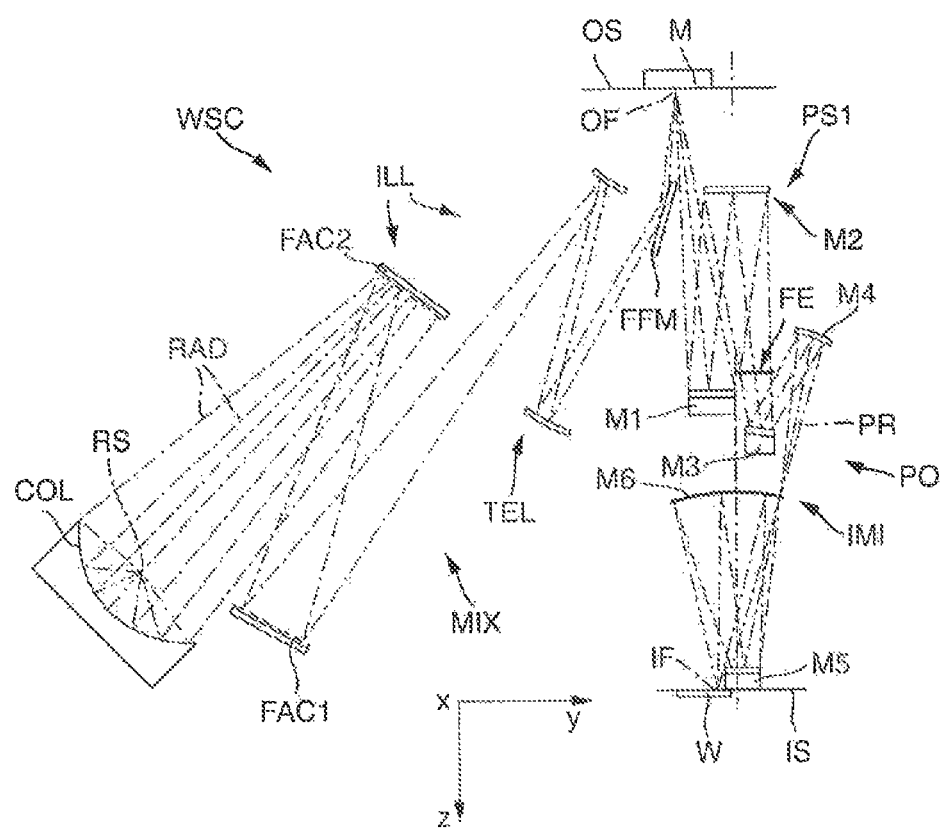
FIG. 19 shows components of an EUV microlithographic projection exposure apparatus in accordance with one embodiment of the invention.

FIG. 19 shows by way of example optical components of an EUV microlithographic projection exposure apparatus WSC in accordance with one embodiment of the invention. The EUV microlithographic projection exposure apparatus serves for the exposure of a radiation-sensitive substrate W arranged in the region of an image plane IS of a projection lens PO with at least one image of a pattern of a reflective patterning device or mask M, said pattern being arranged in the region of an object plane OS of the projection lens.

In order to facilitate the description, a Cartesian xyz coordinate system is indicated, which reveals the respective positional relationship of the components illustrated in the figures. The projection exposure apparatus WSC is of the scanner type. During the operation of the projection exposure apparatus, the mask M and the substrate are moved synchronously in the y-direction and thereby scanned.

The apparatus is operated with the radiation from a primary radiation source RS. An illumination system ILL serves for receiving the radiation from the primary radiation source and for shaping illumination radiation directed onto the pattern. The projection lens PO serves for imaging the structure of the pattern onto a light-sensitive substrate.

The primary radiation source RS can be, inter alia, a laser plasma source or a gas discharge source or a synchrontron-based radiation source. Such radiation sources generate a radiation RAD in the EUV range, in particular having wavelengths of between 5 nm and 15 nm. In order that the illumination system and the projection lens can operate in this wavelength range, they are constructed with components which are reflective to EUV radiation.

The radiation RAD emerging from the radiation source RS is collected by a collector COL and guided into the illumination system ILL. The illumination system comprises a mixing unit MIX, a telescope optical unit TEL and a field forming mirror FFM. The illumination system shapes the radiation and thereby illuminates an illumination field situated in the object plane OS of the projection lens PO or in the vicinity thereof. In this case, the shape and size of the illumination field determine the shape and size of the effectively used object field OF in the object plane OS.

A reflective reticle or some other reflective patterning device is arranged in the object plane OS during the operation of the apparatus.

The mixing unit MIX substantially consists of two facet mirrors FAC1, FAC2. The first facet mirror FAC1 is arranged in a plane of the illumination system which is optically conjugate with respect to the object plane OS. Therefore, it is also designated as a field facet mirror. The second facet mirror FAC2 is arranged in a pupil plane of the illumination system that is optically conjugate with respect to a pupil plane of the projection lens. Therefore, it is also designated as a pupil facet mirror.

With the aid of the pupil facet mirror FAC2 and the imaging optical assembly which is disposed downstream in the beam path and which comprises the telescope optical unit TEL and the field forming mirror FFM operated with grazing incidence, the individual mirroring facets (individual mirrors) of the first facet mirror FAC1 are imaged into the object field.

The spatial (local) illumination intensity distribution at the field facet mirror FAC1 determines the local illumination intensity distribution in the object field. The spatial (local) illumination intensity distribution at the pupil facet mirror FAC2 determines the illumination angle intensity distribution in the object field.

The projection lens PO serves for the reducing imaging of the pattern arranged in the object plane OS of the projection lens into the image plane IS that is optically conjugate with respect to the object plane and lies parallel thereto. This imaging is effected by means of electromagnetic radiation from the extreme ultraviolet range (EUV) around an operating wavelength $\lambda$, which in the case of the example is 13.5 nm.

The projection lens has six mirrors M1 to M6 having mirror surfaces which are arranged in a projection beam path PR between the object plane OS and the image plane IS in such a way that a pattern arranged in the object plane or in the object field OF is imaged into the image plane or the image field IF utilizing the mirrors M1 to M6.

The mirrors (EUV mirrors) M1 to M6 having a reflective effect for radiation from the EUV range each have a substrate, on which is applied a multilayer arrangement having a reflective effect for radiation from the extreme ultraviolet range and comprising a large number of layer pairs comprising alternately relatively low refractive index and relatively high refractive index layer material.

The mirrors M1 to M6 each have curved mirror surfaces, such that each of the mirrors contributes to the imaging. The rays of the projection beam path which come from the object field OF are firstly incident on the slightly convexly curved first mirror M1, which reflects the rays to the slightly concavely curved second mirror M2. The latter reflects the rays to the convex third mirror M3, which deflects the rays laterally to the concave mirror M4. The latter reflects the rays onto the fifth mirror M5, which is arranged geometrically in proximity to the image plane and which has a slightly convexly curved mirror surface and reflects the rays to the large concave mirror M6, which is the last mirror from the image plane and focuses the rays in the direction of the image field IF.

The projection lens consists of two partial lenses. In this case, the first four mirrors M1 to M4 form a first partial lens, which generates an intermediate image IMI in the ray path between the fourth mirror M4 and the fifth mirror M5. The intermediate image lies in an intermediate image plane that is optically conjugate with respect to the object plane and with respect to the image plane. Geometrically, the intermediate image is arranged alongside the sixth mirror M6. The second partial lens, which consists of the fifth and sixth mirrors, images the intermediate image onto the image plane in a reduced fashion.

Projection exposure apparatuses and projection lenses having this or a similar construction are disclosed for example in the U.S. Pat. No. 7,977,651 B2. The disclosure of said patent is incorporated by reference in the content of this description.

At least one of the mirrors M1 to M6 can have a layer construction in accordance with an embodiment of the invention. A reflective coating having a broadband effect in the angle space can be expedient in particular on the fifth mirror M5, at which the largest angle-of-incidence interval occurs. It is also possible for a plurality or all of the mirrors M1 to M6 to be designed in accordance with an embodiment of the invention.

In the illumination system ILL, with the exception of the field forming mirror FFM operated with grazing incidence, all mirrors can benefit from multilayer broadband coatings of the type proposed here. This also applies, in particular, to the multiaxially tiltable individual mirrors of the facet mirrors FACT and FAC2, which can be operated under different angle-of-incidence interval ranges on account of the tiltability.

Figure 14:
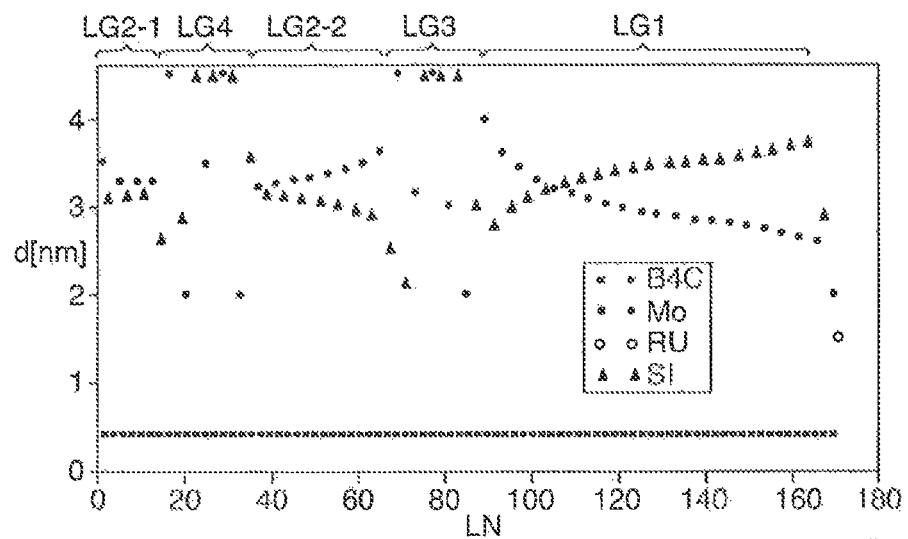
FIG. 14 shows a layer thickness diagram of the eighth exemplary embodiment.

Table A indicates, for all figuratively illustrated exemplary embodiments (B) with the exception of FIG. 14, the geometrical layer thicknesses d[nm] of the individual layers from the layer (LN=1) nearest the substrate to the entrance-side last layer (highest layer number or highest LN value).

TABLE A

| | | B | | | | | | | | |
|---|---|---|---|---|---|---|---|---|---|---|
| | | 2 | 3 | 4 | 5 | 1 FIG. | MS | 6 | 7 | 9 |
| LN | Material | 5 d [nm] | 6 d [nm] | 7 d [nm] | 8 d [nm] | 2 d [nm] | 3 d [nm] | 10 d [nm] | 12 d [nm] | 17 d [nm] |
| 1 | Mo | 3.48 | 3.47 | 3.51 | 3.53 | 3.51 | 3.51 | 4.5 | 3.43 | 2.98 |
| 2 | Si | 3.76 | 3.74 | 3.71 | 3.7 | 3.73 | 3.73 | 2.82 | 3.8 | 4.21 |
| 3 | Mo | 3.48 | 3.47 | 3.51 | 3.53 | 3.51 | 3.51 | 3.98 | 3.43 | 2.98 |
| 4 | Si | 3.76 | 3.74 | 3.71 | 3.7 | 3.73 | 3.73 | 3.3 | 3.8 | 4.21 |

TABLE A-continued

| | | B | | | | | | | | |
|---|---|---|---|---|---|---|---|---|---|---|
| | | 2 | 3 | 4 | 5 | 1 FIG. | MS | 6 | 7 | 9 |
| LN | Material | 5 d [nm] | 6 d [nm] | 7 d [nm] | 8 d [nm] | 2 d [nm] | 3 d [nm] | 10 d [nm] | 12 d [nm] | 17 d [nm] |
| 5 | Mo | 3.48 | 3.47 | 3.51 | 3.53 | 3.51 | 3.51 | 3.72 | 3.43 | 2.98 |
| 6 | Si | 3.76 | 3.74 | 3.71 | 3.7 | 3.73 | 3.73 | 3.54 | 3.8 | 4.21 |
| 7 | Mo | 3.48 | 3.47 | 3.51 | 3.53 | 3.51 | 3.51 | 3.66 | 3.43 | 2.98 |
| 8 | Si | 1.92 | 1.87 | 5.63 | 2.4 | 3.73 | 3.73 | 3.6 | 3.8 | 4.21 |
| 9 | Mo | 3.48 | 3.47 | 3.51 | 3.53 | 3.51 | 3.51 | 3.51 | 2.99 | 2.98 |
| 10 | Si | 1.92 | 1.87 | 5.63 | 2.4 | 1.94 | 3.73 | 1.94 | 2.4 | 4.21 |
| 11 | Mo | 3.48 | 3.47 | 3.51 | 3.53 | 3.51 | 3.51 | 3.51 | 2.99 | 1 |
| 12 | Si | 3.76 | 3.74 | 3.71 | 2.4 | 1.94 | 3.73 | 1.94 | 2.4 | 2.6 |
| 13 | Mo | 3.48 | 3.47 | 3.51 | 3.53 | 3.51 | 3.51 | 3.64 | 3.43 | 2.98 |
| 14 | Si | 3.76 | 3.74 | 3.71 | 3.7 | 3.73 | 3.73 | 3.61 | 3.8 | 4.21 |
| 15 | Mo | 3.48 | 3.47 | 3.51 | 3.53 | 3.51 | 3.51 | 3.69 | 3.43 | 2.98 |
| 16 | Si | 3.76 | 3.74 | 3.71 | 3.7 | 3.73 | 3.73 | 3.57 | 3.8 | 4.21 |
| 17 | Mo | 3.48 | 3.47 | 3.51 | 3.53 | 3.51 | 3.51 | 3.73 | 3.43 | 2.98 |
| 18 | Si | 3.76 | 3.74 | 3.71 | 3.7 | 3.73 | 3.73 | 3.53 | 3.8 | 4.21 |
| 19 | Mo | 3.48 | 3.47 | 3.51 | 3.53 | 3.51 | 3.51 | 3.72 | 3.43 | 2.98 |
| 20 | Si | 3.76 | 3.74 | 3.71 | 3.7 | 3.73 | 3.73 | 3.54 | 3.8 | 4.21 |
| 21 | Mo | 3.48 | 3.47 | 3.51 | 3.53 | 3.51 | 3.51 | 3.7 | 3.43 | 2.98 |
| 22 | Si | 3.76 | 3.74 | 3.71 | 3.7 | 3.73 | 3.73 | 3.56 | 3.8 | 4.21 |
| 23 | Mo | 3.48 | 3.47 | 3.51 | 3.53 | 3.51 | 3.51 | 3.68 | 3.43 | 2.98 |
| 24 | Si | 3.76 | 3.74 | 3.71 | 3.7 | 3.73 | 3.73 | 3.57 | 3.8 | 4.21 |
| 25 | Mo | 3.48 | 3.47 | 3.51 | 3.53 | 3.51 | 3.51 | 3.67 | 3.43 | 2.98 |
| 26 | Si | 3.76 | 5.68 | 5.63 | 3.7 | 3.73 | 3.73 | 3.58 | 3.8 | 4.21 |
| 27 | Mo | 3.48 | 3.47 | 3.51 | 3.53 | 3.51 | 3.51 | 3.66 | 3.43 | 2.98 |
| 28 | Si | 1.99 | 5.68 | 5.63 | 5.09 | 3.73 | 3.73 | 3.59 | 3.8 | 4.21 |
| 29 | Mo | 3.48 | 3.47 | 3.51 | 3.53 | 3.51 | 3.51 | 3.65 | 3.43 | 2.98 |
| 30 | Si | 1.99 | 3.74 | 3.71 | 5.09 | 3.73 | 3.73 | 3.6 | 3.8 | 4.21 |
| 31 | Mo | 3.48 | 3.47 | 3.51 | 3.53 | 3.51 | 3.51 | 3.63 | 3.43 | 2.98 |
| 32 | Si | 3.76 | 3.74 | 3.71 | 5.09 | 3.73 | 3.73 | 3.62 | 3.8 | 4.21 |
| 33 | Mo | 3.48 | 3.47 | 3.51 | 3.53 | 3.51 | 3.51 | 3.61 | 3.43 | 2.98 |
| 34 | Si | 3.76 | 3.74 | 3.71 | 3.7 | 3.73 | 3.73 | 3.63 | 3.8 | 4.21 |
| 35 | Mo | 3.48 | 3.47 | 3.51 | 3.53 | 3.51 | 3.51 | 3.59 | 3.43 | 2.98 |
| 36 | Si | 3.76 | 3.74 | 3.71 | 3.7 | 3.73 | 3.73 | 3.66 | 3.8 | 4.21 |
| 37 | Mo | 3.48 | 3.47 | 3.51 | 3.53 | 3.51 | 3.51 | 3.56 | 3.43 | 2.98 |
| 38 | Si | 3.76 | 3.74 | 3.71 | 3.7 | 3.73 | 3.73 | 3.68 | 3.8 | 4.21 |
| 39 | Mo | 3.48 | 3.47 | 3.51 | 3.53 | 3.51 | 3.51 | 3.53 | 3.43 | 2.98 |
| 40 | Si | 3.76 | 3.74 | 3.71 | 3.7 | 3.73 | 3.73 | 3.71 | 3.8 | 4.21 |
| 41 | Mo | 3.48 | 3.47 | 3.51 | 3.53 | 3.51 | 3.51 | 3.49 | 3.43 | 2.98 |
| 42 | Si | 3.76 | 3.74 | 3.71 | 3.7 | 3.73 | 3.73 | 3.75 | 3.8 | 4.21 |
| 43 | Mo | 3.48 | 3.47 | 3.51 | 3.53 | 3.51 | 3.51 | 3.44 | 3.43 | 2.98 |
| 44 | Si | 3.76 | 3.74 | 3.71 | 3.7 | 3.73 | 3.73 | 3.79 | 3.8 | 4.21 |
| 45 | Mo | 3.48 | 3.47 | 3.51 | 3.53 | 3.51 | 3.51 | 3.4 | 3.43 | 2.98 |
| 46 | Si | 3.76 | 3.74 | 3.71 | 3.7 | 3.73 | 3.73 | 3.83 | 3.8 | 4.21 |
| 47 | Mo | 3.48 | 3.47 | 3.51 | 3.53 | 3.51 | 3.51 | 3.36 | 3.43 | 2.98 |
| 48 | Si | 3.76 | 3.74 | 3.71 | 3.7 | 3.73 | 3.73 | 3.87 | 3.8 | 4.21 |
| 49 | Mo | 3.48 | 3.47 | 3.51 | 3.53 | 3.51 | 3.51 | 3.32 | 3.43 | 2.98 |
| 50 | Si | 3.76 | 3.74 | 3.71 | 3.7 | 3.73 | 3.73 | 3.9 | 3.8 | 4.21 |
| 51 | Mo | 3.48 | 3.47 | 3.51 | 3.53 | 3.51 | 3.51 | 3.2 | 3.43 | 2.98 |
| 52 | Si | 3.76 | 3.74 | 3.71 | 3.7 | 3.73 | 3.73 | 4.02 | 3.8 | 4.21 |
| 53 | Mo | 3.48 | 3.47 | 3.51 | 3.53 | | | | | 2.98 |
| 54 | Si | 3.76 | 3.74 | 3.71 | 3.7 | | | | | 4.21 |
| 55 | Mo | 3.48 | 3.47 | 3.51 | 3.53 | | | | | |
| 56 | Si | 3.76 | 3.74 | 3.71 | 3.7 | | | | | |
| 57 | Mo | 3.48 | 3.47 | 3.51 | 3.53 | | | | | |
| 58 | Si | 3.76 | 3.74 | 3.71 | 3.7 | | | | | |
| 59 | Mo | 3.48 | 3.47 | 3.51 | 3.53 | | | | | |
| 60 | Si | 3.76 | 3.74 | 3.71 | 3.7 | | | | | |
| 61 | Mo | 3.48 | 3.47 | 3.51 | 3.53 | | | | | |
| 62 | Si | 3.76 | 3.74 | 3.71 | 3.7 | | | | | |
| 63 | Mo | 3.48 | 3.47 | 3.51 | 3.53 | | | | | |
| 64 | Si | 3.76 | 3.74 | 3.71 | 3.7 | | | | | |
| 65 | Mo | 3.48 | 3.47 | 3.51 | 3.53 | | | | | |
| 66 | Si | 3.76 | 3.74 | 3.71 | 3.7 | | | | | |
| 67 | Mo | 3.48 | 3.47 | 3.51 | 3.53 | | | | | |
| 68 | Si | 3.76 | 3.74 | 3.71 | 3.7 | | | | | |
| 69 | Mo | 3.48 | | | 3.53 | | | | | |
| 70 | Si | 3.76 | | | 3.7 | | | | | |
| 71 | Mo | 3.48 | | | 3.53 | | | | | |
| 72 | Si | 3.76 | | | 3.7 | | | | | |

What is claimed is:

1. A mirror for extreme ultraviolet light (EUV mirror) comprising:
    a substrate and a multilayer arrangement applied on the substrate, which multilayer arrangement reflects radiation having an extreme ultraviolet (EUV) wavelength $\lambda$ and comprises a plurality of layer pairs having layers that alternate between first layers and second layers, wherein the first layers and the second layers comprise respective materials having mutually differing indices of refraction,
    wherein the multilayer arrangement has:
    a periodic first layer group (LG1) having a first number N1>1 of first layer pairs, which are arranged on a radiation entrance side of the multilayer arrangement and have a first period thickness P1;
    a periodic second layer group (LG2) having a second number N2>1 of second layer pairs, which are arranged between the first layer group and the substrate and have a second period thickness P2; and
    a third layer group (LG3) having a third number N3 of third layer pairs, which are arranged between the first layer group and the second layer group,
    wherein the first number N1 is greater than the second number N2; and
    wherein the third layer group has a third period thickness P3 which deviates from an average period thickness $P_M=(P1+P2)/2$ by a period thickness difference $\Delta P$, wherein the period thickness difference $\Delta P$ substantially corresponds to the quotient of the optical layer thickness ($\lambda/4$) of a quarter-wave layer and the product of the third number N3 and $\cos(AOI_M)$, wherein $AOI_M$ is the mean angle of incidence for the multilayer arrangement, wherein $\Delta P=x*(\lambda/(N3 \cos(AOI_M)))$ for the period thickness difference $\Delta P$ and wherein $0.2 \le x \le 0.35$;
    said EUV mirror further comprising:
    a fourth layer group (LG4), which has a fourth number N4 of fourth layer pairs and a fourth period thickness P4 which deviates from the mean period thickness $P_M$ by a further period thickness difference $\Delta P$, wherein the further period thickness difference $\Delta P$ substantially corresponds to the quotient of the optical layer thickness ($\lambda/4$) of a quarter-wave layer and the product of the fourth number N4 and $\cos(AOI_M)$, wherein the fourth layer group is arranged between the third layer group and the substrate and at least one second layer pair of the second layer group is arranged between the third layer group and the fourth layer group.

2. The EUV mirror according to claim 1, wherein the third layer group has no individual layer whose layer thickness is greater than or equal to $\lambda/(2*\cos(AOI_M))$.

3. The EUV mirror according to claim 2, wherein a maximum value of an individual layer thickness of the third layer group is less than $0.9*\lambda/(2*\cos(AOI_M))$.

4. The EUV mirror according to claim 1, wherein $0.25 \le x \le 0.35$.

5. The EUV mirror according to claim 1, wherein $2 \le N3 \le 5$.

6. The EUV mirror according to claim 1, wherein the third layer group has two or more layer pairs and has a periodic layer construction having substantially identical third period thicknesses.

7. The EUV mirror according to claim 6, wherein the third layer group has a strictly periodic layer construction.

8. The EUV mirror according to claim 1, wherein the third period thickness of the third layer group (LG3) is less than the first period thickness and/or the second period thickness by the period thickness difference $\Delta P$, or wherein the third period thickness of the third layer group is greater than the first period thickness and/or the second period thickness by the period thickness difference $\Delta P$.

9. The EUV mirror according to claim 1, wherein $2 \le N4 \le 5$.

10. The EUV mirror according to claim 1, wherein the fourth layer group (LG4) has two or more layer pairs and has a periodic layer construction having substantially identical fourth period thicknesses.

11. The EUV mirror according to claim 10, wherein the fourth layer group has a strictly periodic layer construction.

12. The EUV mirror according to claim 1, wherein the first layer group (LG1) is strictly periodic and/or wherein the second layer group (LG2) is strictly periodic.

13. The EUV mirror according to claim 1, wherein the first period thickness P1 is equal to the second period thickness P2.

14. The EUV mirror according to claim 1, wherein N1>10.

15. The EUV mirror according to claim 14, wherein N1>15.

16. The EUV mirror according to claim 1, wherein a layer thickness of the first layers and of the second layers in all layer pairs of the first, second and third layer groups is identical.

17. The EUV mirror according to claim 1, wherein one of the layer materials of the layer pairs in all layer groups has the same layer thickness.

18. The EUV mirror according to claim 1, wherein the layer groups comprise differingly absorbent layer materials, and wherein a ratio $\Gamma$ between a layer thickness of the more highly absorbent layer material and the period thickness of the layer pairs within at least one of the layer groups varies.

19. The EUV mirror according to claim 18, wherein the value of $\Gamma$ varies continuously within a layer group.

20. The EUV mirror according to claim 18, wherein the value of $\Gamma$ increases or decreases from layer pair to layer pair from the substrate side of a layer group to that side of the layer group which lies nearer to the radiation entrance side.

21. An optical system comprising at least one EUV mirror according to claim 1.

22. An optical system according to claim 21, wherein the optical system is a projection lens or an illumination system for a microlithographic projection exposure apparatus.

* * * * *

UNITED STATES PATENT AND TRADEMARK OFFICE
CERTIFICATE OF CORRECTION

PATENT NO. : 9,915,876 B2
APPLICATION NO. : 14/796612
DATED : March 13, 2018
INVENTOR(S) : Thomas Schicketanz et al.

Page 1 of 1

It is certified that error appears in the above-identified patent and that said Letters Patent is hereby corrected as shown below:

Column 20, Line 47, replace "FACT" with --FAC1--

Signed and Sealed this
Twenty-ninth Day of January, 2019

Andrei Iancu
*Director of the United States Patent and Trademark Office*